United States Patent
Burns et al.

(10) Patent No.: US 7,215,218 B2
(45) Date of Patent: May 8, 2007

(54) BALUN TRANSFORMER WITH MEANS FOR REDUCING A PHYSICAL DIMENSION THEREOF

(75) Inventors: Lawrence M. Burns, Laguna Hills, CA (US); Carl W. Pobanz, Topanga, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/984,771

(22) Filed: Nov. 10, 2004

(65) Prior Publication Data

US 2005/0088252 A1 Apr. 28, 2005

Related U.S. Application Data

(62) Division of application No. 09/892,755, filed on Jun. 28, 2001, now Pat. No. 6,819,199.

(60) Provisional application No. 60/262,629, filed on Jan. 22, 2001.

(51) Int. Cl.
*H01P 5/10* (2006.01)
(52) U.S. Cl. .......................... 333/26; 333/32
(58) Field of Classification Search .................. 333/26, 333/32
See application file for complete search history.

(56) References Cited

U.S. PATENT DOCUMENTS 5,644,272 A * 7/1997 Dabrowski .................... 333/26

| 5,697,088 | A | 12/1997 | Gu |
| 6,018,277 | A * | 1/2000 | Vaisanen ................. 333/26 |
| 6,483,415 | B1 | 11/2002 | Tang |
| 6,535,077 | B1 | 3/2003 | Hiroshima et al. |
| 6,714,094 | B1 * | 3/2004 | Gill ........................ 333/26 |

FOREIGN PATENT DOCUMENTS

EP 0 866 513 9/1998
EP 1 045 469 10/2000

OTHER PUBLICATIONS

Nishikawa Kenjiro et al., "Compact and Broad-Band Three-Dimensional MMIC Balun," IEEE Transactions on Microwave Theory and Techniques, IEEE, vol. 47, No. 1, Jan. 1999, pp. 96-98.

(Continued)

*Primary Examiner*—Benny Lee
(74) *Attorney, Agent, or Firm*—Sterne, Kessler, Goldstein & Fox P.L.L.C.

(57) ABSTRACT

The invention is a balun transformer that converts a single-ended (or unbalanced) signal to a differential (or balanced) signal. The balun is a printed metal pattern on a circuit board in conjunction with several low cost chip capacitors and a low cost chip inductor. The balun transformer is a modified Marchand balun that is implemented using printed transmission lines. The balun has a plurality of coupled transmission lines to improve tolerances to variations in PC board fabrication. To make the balun compact, it is electrically lengthened through the use of capacitive loading, which reduces the required physical size. Additionally, the capacitors increase the bandwidth due to the resonant interaction between the short inductive balun and the capacitors that are placed in series with the input and the output.

6 Claims, 21 Drawing Sheets

OTHER PUBLICATIONS

Gokdemir T. et al., "Design and Performance of GaAs MMIC CPW Baluns Using Overlaid and Spiral Couplers," Department of Electronic and Electrical Engineering, King's College, Strand, London, 1997 IEEE MTT-S Digest, pp. 401-404.

Tsai M.C., "A New Compact Wideband Balun," Raytheon Company, Research Division, 1993 IEEE MTT-S Digest, pp. 141-143.

Prieto, D. et al., CPS Structure Potentialities For MMICS: A CPS/CPW Transition And A Bias Network, IEEE MTT-S Digest, MTT-S, International, Baltimore, MD, Jun. 7-12, 1998; pp. 111-114.

Schellenberg, J. et al., "Low-Loss, Planar monolithic Baluns For K/Ka-Band Applications", IEEE MTT-S Digest, MTT-S International, Anaheim, CA, Jun. 13-19, 1999, pp. 1733-1736.

European Patent Office Communication, dated Mar. 12, 2003 with attached Partial European Search Report.

* cited by examiner

COPLANAR WAVEGUIDE WITH GROUND (CPWG)

COPLANAR WAVEGUIDE (CPW)

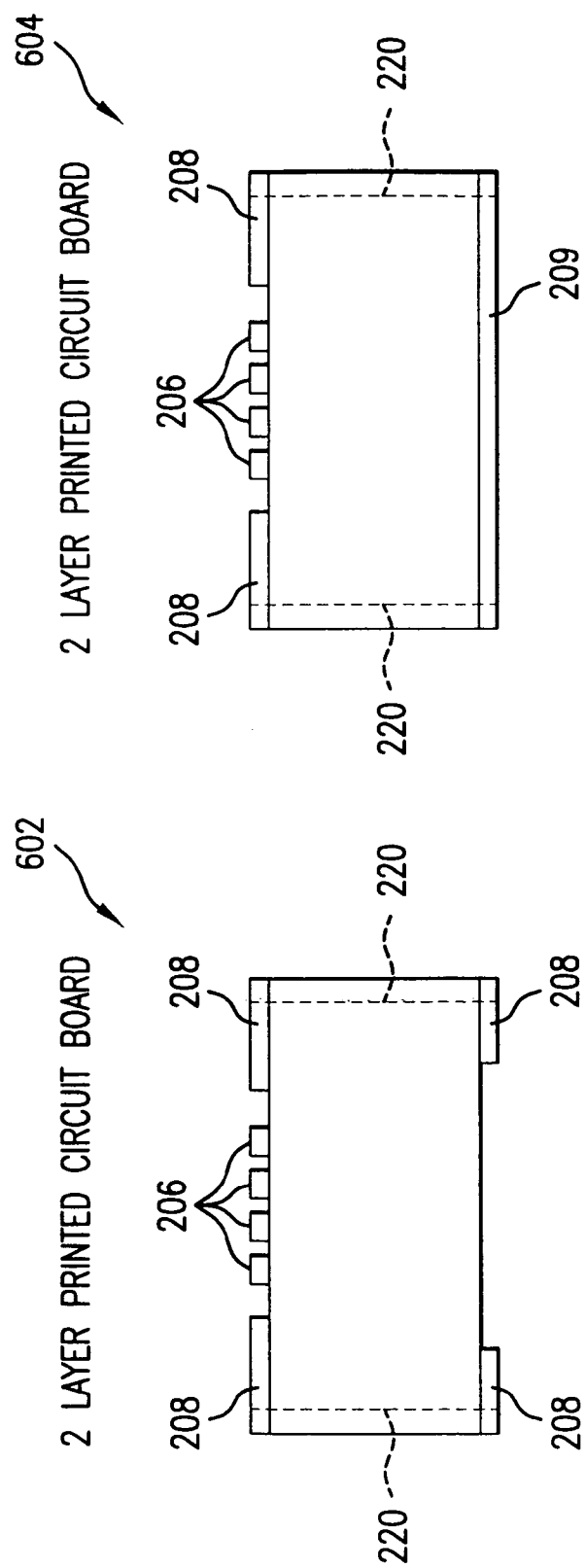

BALUN TRANSFORMER WITH MEANS FOR REDUCING A PHYSICAL DIMENSION THEREOF

CROSS-REFERENCE TO RELATED APPLICATIONS

This application is a divisional of U.S. application Ser. No. 09/892,755, filed Jun. 28, 2001 now U.S. Pat. No. 6,819,199, entitled "Balun Transformer with Means for Reducing a Physical Dimension Thereof," which claims benefit of U.S. Provisional Application No. 60/262,629, filed Jan. 22, 2001, each of which is incorporated herein by reference in its entirety.

BACKGROUND OF THE INVENTION

1. Field of the Invention

This invention relates generally to balanced to unbalanced transformers (baluns) and more particularly to an improved Marchand balun adapted for use on printed circuit boards.

2. Background Art

In radio frequency integrated circuits, it is often desirable for the input and output connections to be differential. An example of a differential connection is two wires having an equal impedance to a common ground conductor, their respective signals 180 degrees out of phase. A transmission line having these characteristics is known as a balanced line, as opposed to an unbalanced line. The advantages of a balanced radio frequency signal input over an unbalanced input include higher dynamic range, higher bandwidth, and lower pick-up and generation of interference.

Unfortunately, many radio frequency components, such as coaxial cable, are unbalanced. An adapter is required to convert the unbalanced signal into a balanced one without loss or distortion and while maintaining the proper matching impedance to terminate the transmission line. A passive device that achieves this function is known as a balun, and can be constructed in various ways. Many existing passive baluns either are too large, too expensive, too complex or have an insufficient bandwidth to be effectively implemented in a printed circuit board RF application.

What is needed is a passive balun that exhibits low signal distortion, high bandwidth, low loss, and has a good impedance match. Additionally, the passive balun should be small, simple to manufacture, and tolerant of variations.

BRIEF SUMMARY OF THE INVENTION

The invention is a modified Marchand balun implemented using a plurality of first coupled printed metal traces electromagnetically coupled to a plurality of second coupled printed metal traces. The second coupled metal traces are also coupled to ground. Capacitors are coupled between the balun input and the first coupled metal traces, between ground and the first metal traces and between the second coupled printed metal traces and each of a pair of balun outputs.

The balun outputs a balanced signal, one output having an equal amplitude and opposite phase relative to a second output. Some of the metal traces comprising the balun are configured as transmission lines. These transmission lines are either coplanar waveguide transmission lines or microstrip transmission lines. A ground is located at the periphery or beneath the balun. Some embodiments place a ground at the periphery and below the balun. An impedance matching network is coupled to the input of the balun and an impedance matching network is coupled to the balanced output. Both the input and output impedance matching networks can comprise lumped or distributed element components.

A capacitor and spiral inductor can be coupled to the balun input. A direct current or voltage source and low frequency digital control signals can be applied to the balun input without electrically loading the balun at a desired input signal frequency. The applied direct current or voltage source can power various active circuits such as a low noise block via a coaxial cable.

The value of each lumped element, each distributed element and the width and spacing of the printed metal traces is incrementally varied in a simulator to determine the specific values that result in the desired balun circuit characteristics.

BRIEF DESCRIPTION OF THE FIGURES

The present invention is described with reference to the accompanying drawings. In the drawings, like reference numbers indicate identical or functionally similar elements. Additionally, the leftmost digit(s) of a reference number identifies the drawing in which the reference number first appears.

FIG. 6A illustrates cross section of a two layer printed circuit board without ground plane under the balun traces.

FIG. 6B illustrates cross section of a two layer printed circuit board with ground plane under the balun traces.

DETAILED DESCRIPTION OF THE INVENTION

I. Example Environment

Figure 1A:
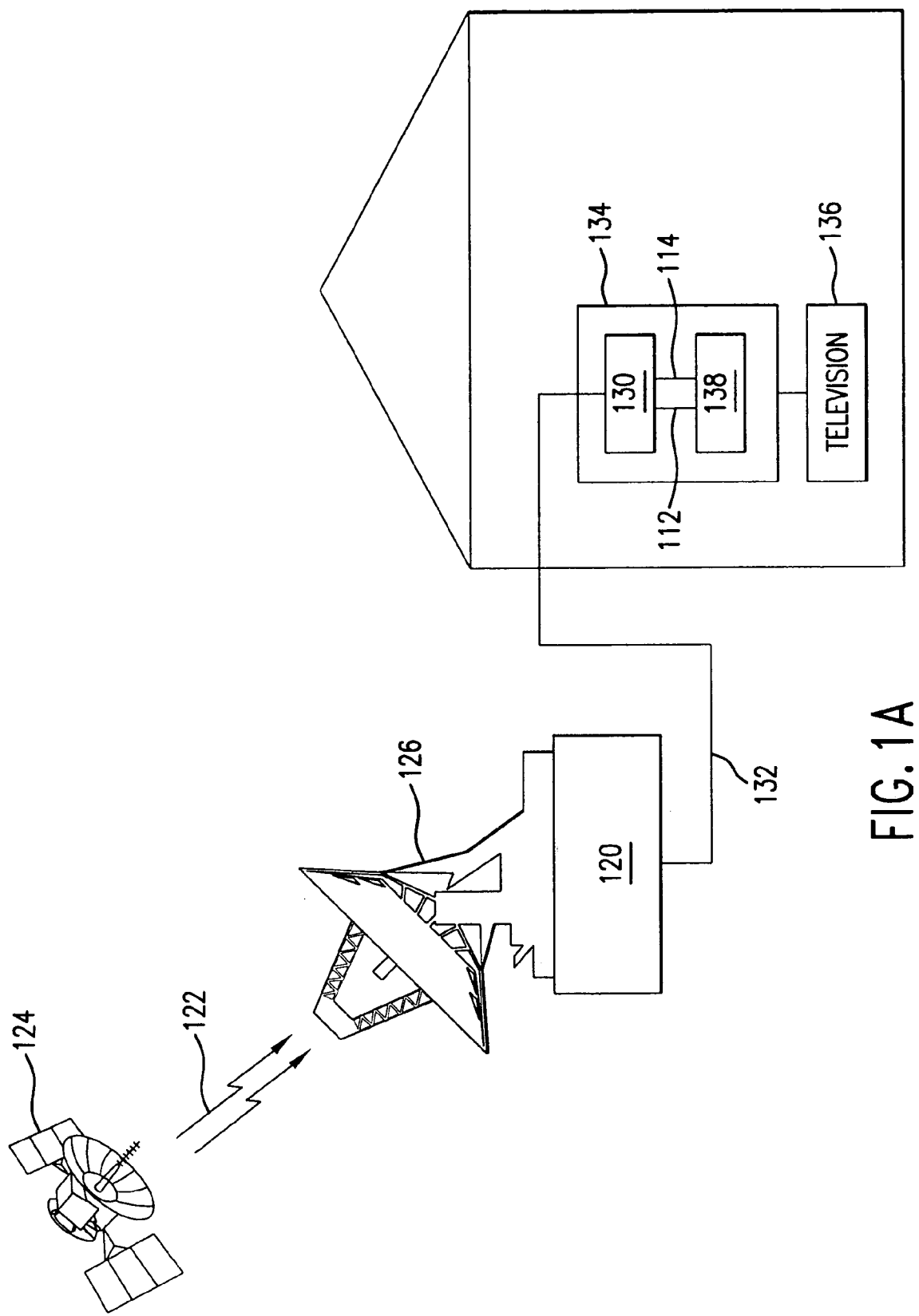
FIG. 1A illustrates a satellite receiver and set top box embodying the present invention.

Referring to FIG. 1A, an example system implementing this invention is illustrated. A data signal 122 from a satellite 124 is received at a dish antenna 126 and routed to a low noise block 120. Typically, low noise block 120 comprises a low noise amplifier, a mixer, an oscillator and an IF amplifier. Low noise block 120 amplifies and converts data signal 122 to a desired frequency range from data signal 122 downlink frequency. In one embodiment the desired frequency range is 950–2150 MHz. Data signal 122 is passed over a coaxial cable 132 from low noise block 120 to a television set-top box 134. Set-top box 134 comprises a tuner circuit 138 that converts data signal 122 into a signal suitable for reception by a television 136. An example commercial embodiment of tuner 138 is the Broadcom BCM3440A0.

It is preferable that tuner 138 have a differential radio frequency input in order to achieve the low second order nonlinear distortion that is critical to a direct conversion receiver architecture. A balun 130 is placed between coaxial cable 132 and tuner 138 to convert the unbalanced radio frequency signal carried in coaxial cable 132 to a balanced radio frequency signal 112 and 114 at the input of tuner 138.

An embodiment of the invention is a balun implemented as a printed metal pattern on a circuit board containing the tuner chip and its ancillary components. In addition to meeting the required electrical specifications, the printed balun is tolerant of parameter variations during printed circuit board manufacturing. These parameter variations include metal line width, spacing between metal lines, printed circuit board thickness, dielectric constant of the board, and proximity to other metal objects. Tolerance of printed circuit board manufacturing variations enables the printed balun design to be easily incorporated into a standard printed circuit board assembly process. In a preferred embodiment the balun output lines should be located close together to interface properly with an integrated circuit package.

II. Marchand Balun

Figure 1B:
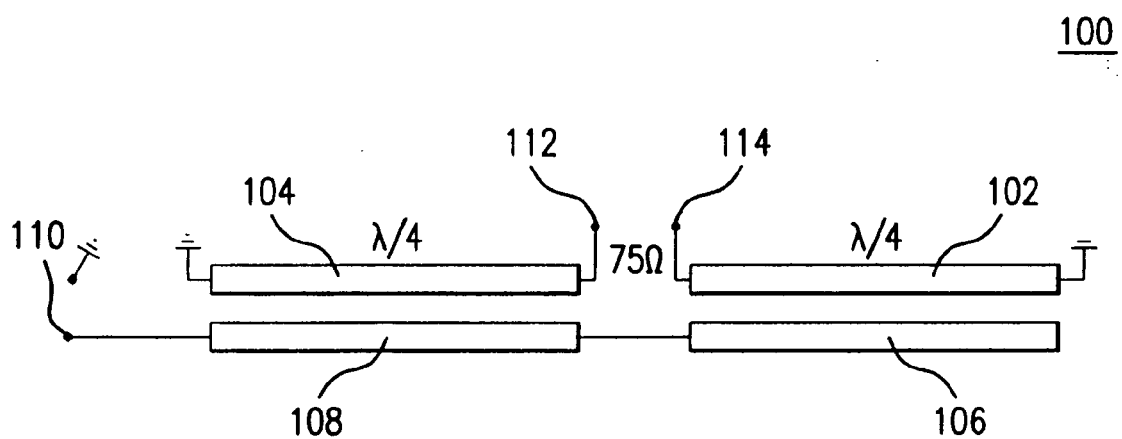
FIG. 1B illustrates a classic prior art Marchand balun.

One suitable structure is the Marchand balun 100, shown in FIG. 1B. This classic balun implementation uses two quarter-wavelength (λ/4) sections of coaxial cable inside another coaxial shield. One section includes electromagnetically coupled lines 104 and 108, and the other section includes electromagnetically coupled lines 102 and 106. The electromagnetic coupling between coaxial line 102 and 106 and between 104 and 108 results in a signal at balun output 112 that is equal in amplitude and opposite in phase to a signal at balun output 114 relative to an input signal at balun input 110. FIG. 1B includes an exemplary impedance value of 75Ω at outputs 112 and 114.

Figure 2B:
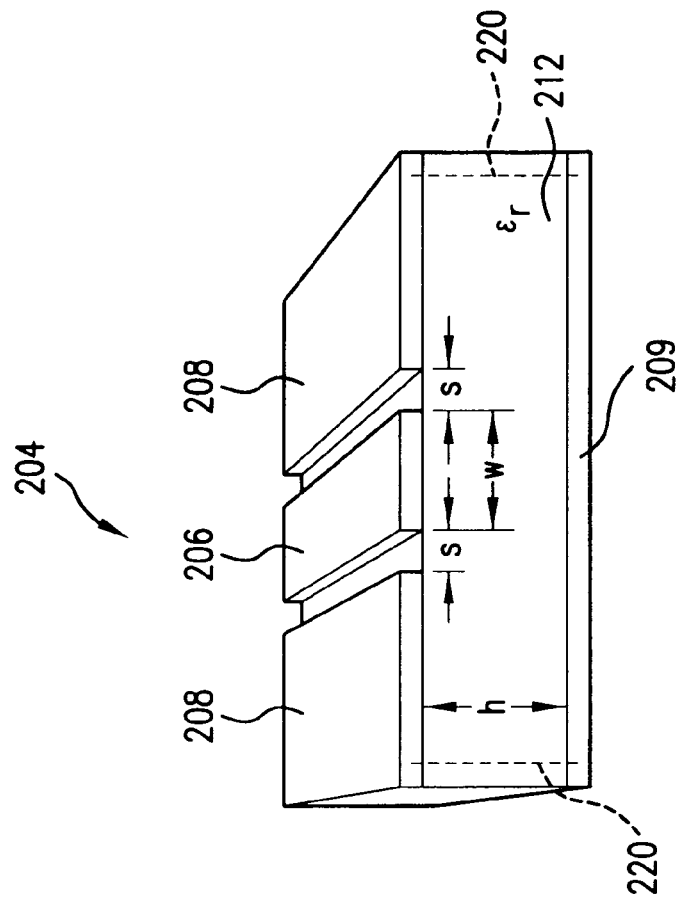
FIG. 2B illustrates a cross section of a coplanar waveguide with ground.
Figure 2A:
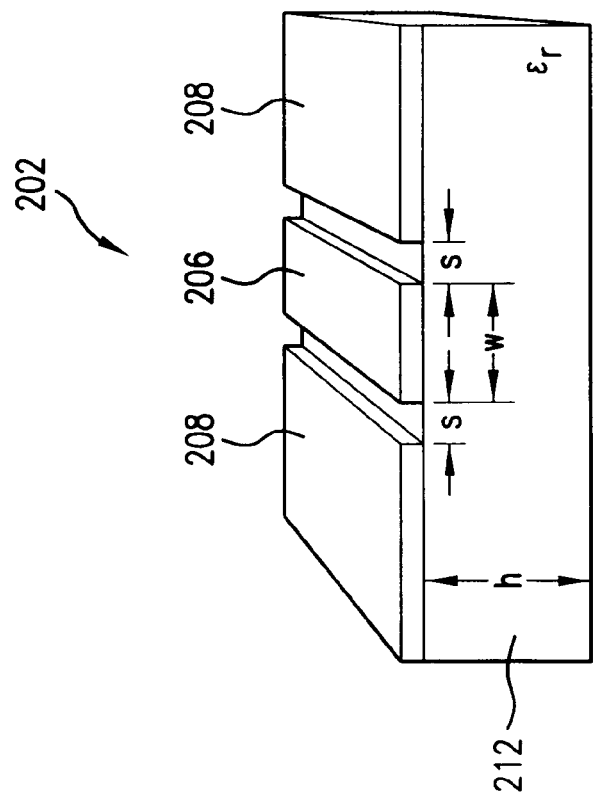
FIG. 2A illustrates a cross section of a coplanar waveguide.
Figure 3:
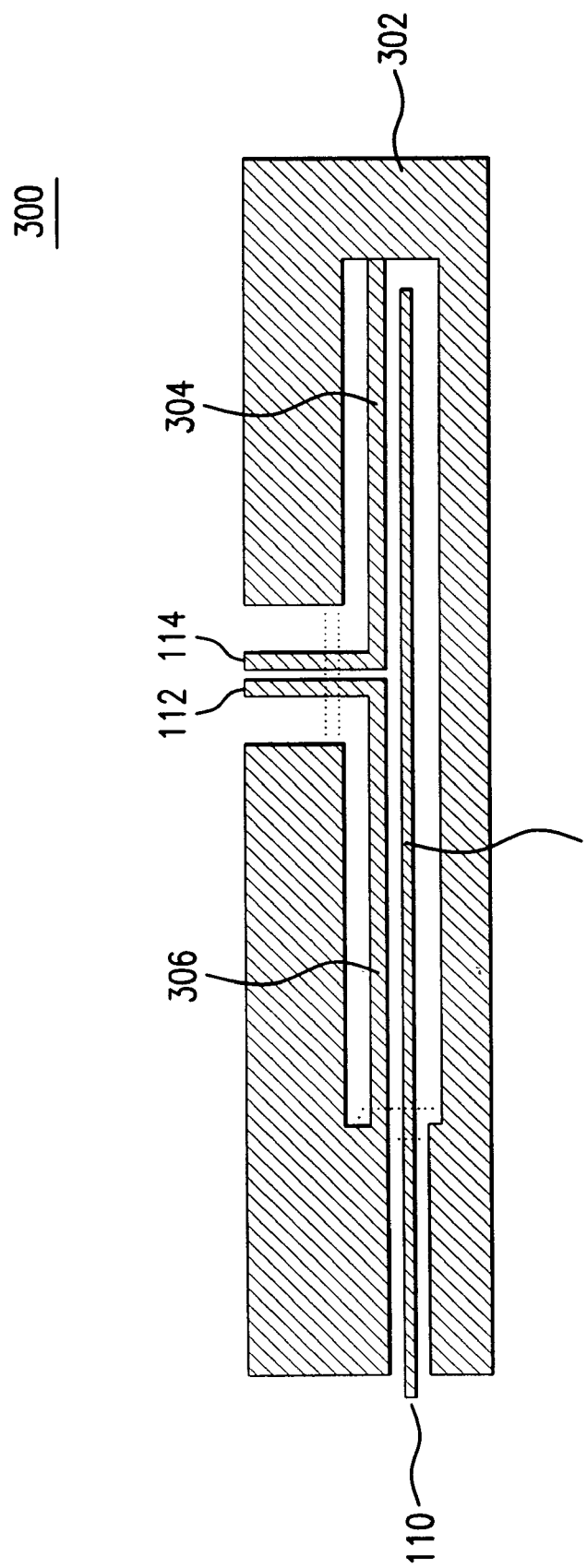
FIG. 3 illustrates a coplanar waveguide implantation of the classic prior art Marchand balun.

A coaxial cable can be flattened and adapted into printable form by cross sectioning the coaxial structure and flattening the conductors into coplanar waveguides. Referring to FIG. 2A, a coplanar waveguide 202 comprises a signal trace 206 flanked on both sides by a ground 208. Signal trace 206 and ground 208 are laid on a substrate 212. Referring to FIG. 2B, a coplanar waveguide with ground 204 comprises the elements of waveguide 202 and an additional ground 209 under metal trace 206. In coplanar waveguide 204, ground 208 can be connected with ground 209 by vias 220 through substrate 212. In FIGS. 2A and 2B, the reference labels "s" and "w" represent conductor spacing width: the reference label "h" represents dielectric height of the substrate 212; and the reference label "$\epsilon_r$" represents the dielectric constant of the substrate 212. Balun 100 is modified for printed circuit board use by transforming coaxial cable into the coplanar waveguide 202 as illustrated in FIG. 3. Vias 220 (e.g., see FIG. 2B), also known as plated through holes, provide electrical connection between different layers in multi layer printed circuit boards.

Referring to FIG. 3, the coplanar balun 300 consists of balun input 110 coupled to input coplanar waveguide 308. First coplanar waveguide 304 and second coplanar waveguide 306 are coupled to balun output 114 and balun output 112, respectively. Coplanar waveguides 304 and 306 are coupled to a ground 302. The electromagnetic coupling between coplanar waveguides 304, 306, 308 result in a signal at output 112 that is equal in amplitude and opposite in phase to a signal from balun output 114 relative to an input signal input to balun input 110.

Previous printed circuit implementations of the Marchand balun have had disadvantages relative to the present invention. For example, in *Compact and Broad-Band Three Dimensional MMIC Balun*, IEEE Transactions on Microwave Theory and Techniques, Vol. 47, No.1 January, 1999, which is incorporated herein by reference in its entirety, a printed circuit balun implementation is presented. The described balun requires the input and output lines to be placed in different layers of the circuit board and thus the balun's proper operation depends critically on dielectric thickness, which is not desirable for printed circuit board implementation. Due to the use of full quarter-wavelength lines, the described balun transmission lines must be meandered across the printed circuit board to achieve a compact size. The meandered transmission lines disturb the described balun's operation, which is corrected by adding an additional transmission line that, undesirably, necessitates spreading the output lines far apart.

Another Marchand balun is discussed in *Design and Performance of GaAs MMIC CPW Baluns Using Overlaid and Spiral Couplers*, 1997 IEEE MTT-S Digest, which is incorporated herein by reference in its entirety. The balun discussed is a conventional two-wire Marchand using a coplanar layout. To achieve the required coupling between the transmission lines is difficult with only two wires. To compensate, a complicated overlay scheme is used which is not compatible with a printed circuit board fabrication process. No size reduction schemes are used, so the balun is undesirably large for use on a printed circuit board.

A third example of the conventional Marchand balun is discussed in *A New Compact Wideband Balun*, 1993 IEEE MTT-S Digest, which is incorporated herein by reference in its entirety. The balun discussed is made of multiple coupled microstrip lines, so the balun depends critically on dielectric parameters and distance between layers. Multiple lines are used to relax the conductor spacing, but the layout results in the output ports exiting on opposite sides of the balun.

III. The Invention

The preferred embodiment of the present invention is now described with reference to the figures where like reference numbers illustrate like elements. Furthermore, the left digit of each reference number corresponds to the figure in which the reference number is first used. While specific methods and configurations are discussed, it should be understood that this is done for illustration purposes only. A person skilled in the art will recognize that other configurations and procedures may be used without departing from the spirit and scope of the invention.

Figure 4A:
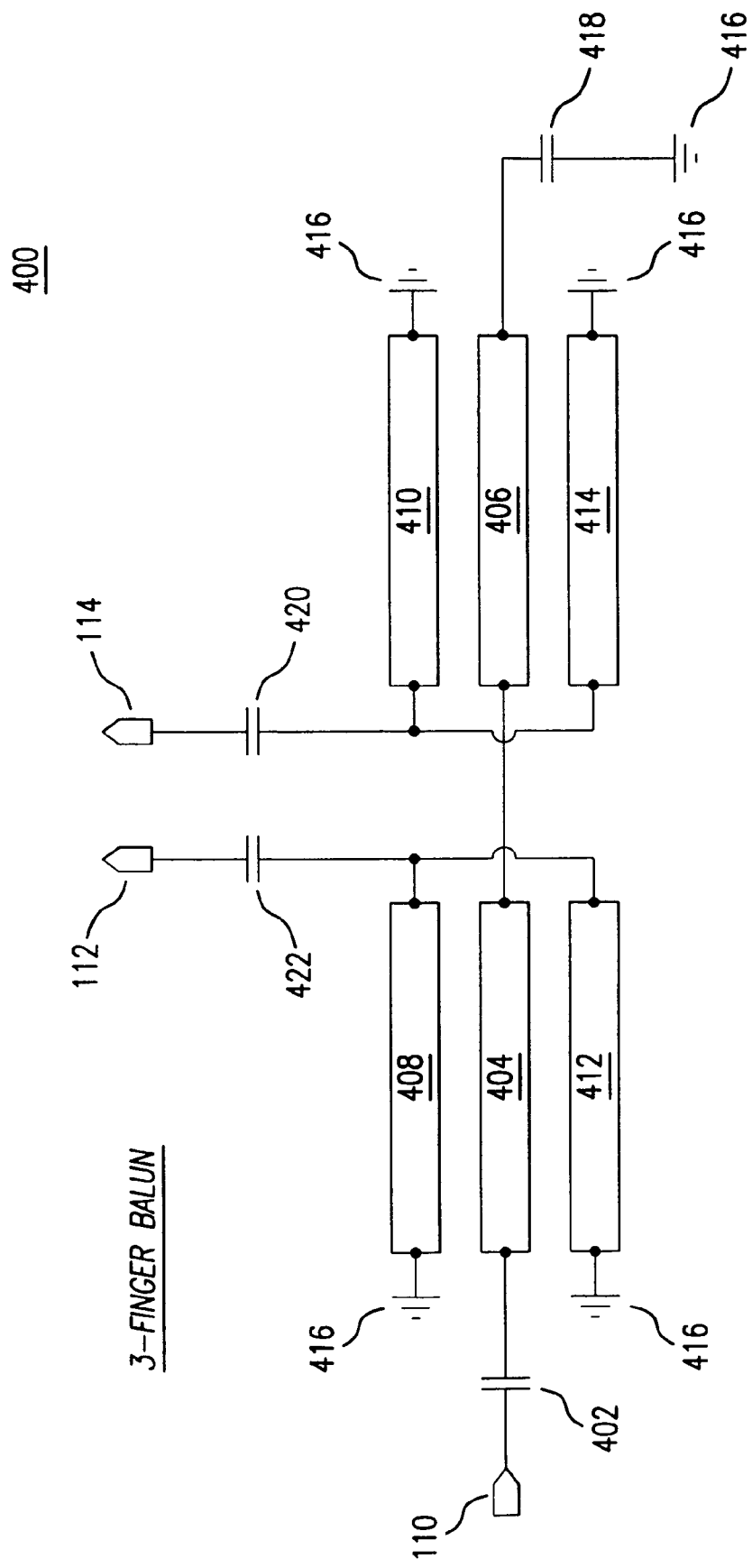
FIG. 4A illustrates a circuit diagram for a 3-Finger balun according to the present invention.

Referring to FIG. 4A, a 3-Finger balun transformer, according to the present invention; is presented as an electrical circuit schematic. Balun 400 consists of transmission lines 404, 406, 408, 410, 412, and 414. Transmission line 404 is coupled to transmission line 406. Input capacitor 402 is coupled to transmission line 404 and balun input 110. A loading capacitor 418 is coupled to transmission line 406 and a ground 416. Transmission lines 408, 410, 412, and 414 are coupled to ground 416. Output capacitor 422 is coupled to transmission lines 408, 412 and to positive balun output 112. Output capacitor 420 is coupled to transmission lines 410, 414 and to negative balun output 114. Transmission lines 404, 408, and 412 are electromagnetically coupled. Transmission lines 406, 410, and 414 are electromagnetically coupled. The electromagnetic coupling between transmission lines 404, 406, 408, 410, 412, and 414 result in a signal at output 112, in response to a signal applied to balun input 110, that is equal in amplitude and opposite in phase to a signal at output 114.

Figure 4B:
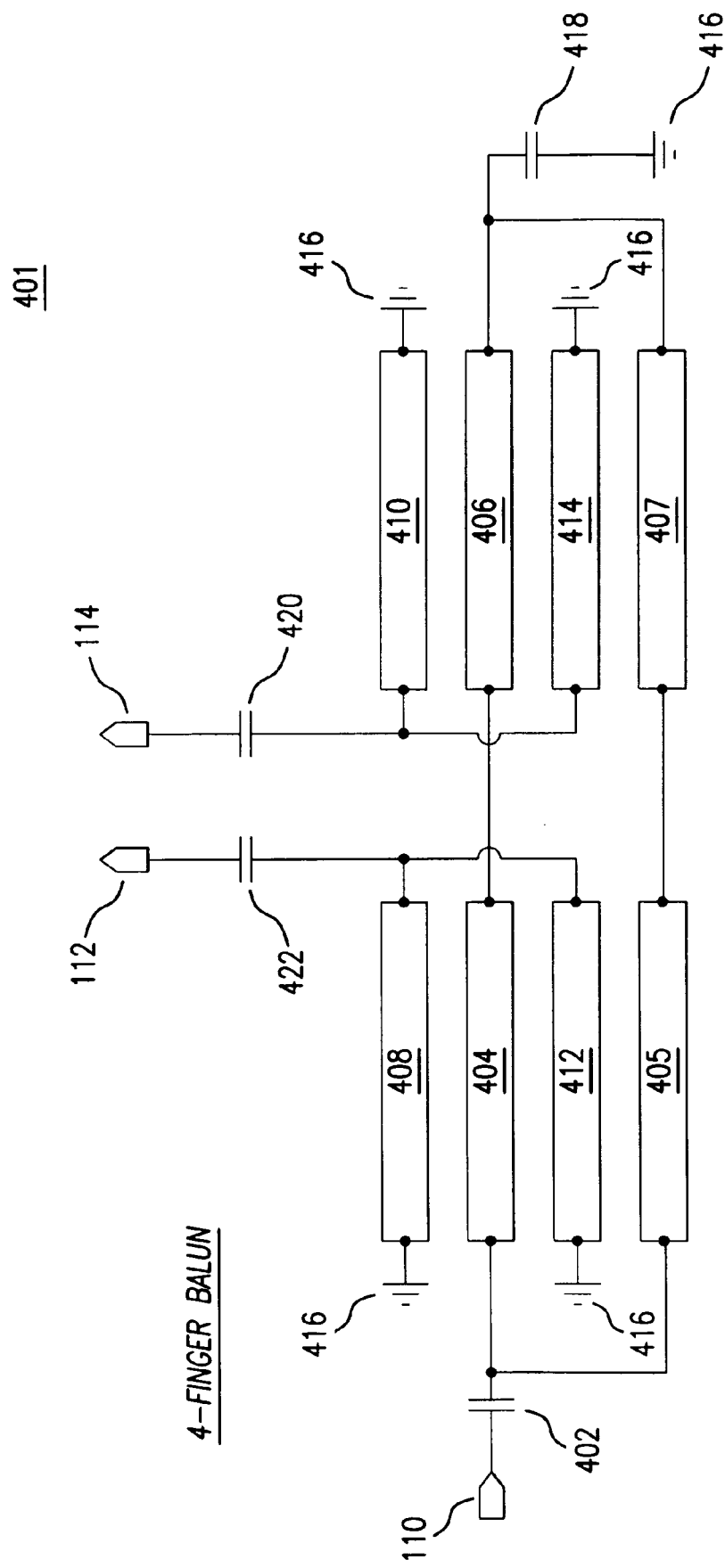
FIG. 4B illustrates a circuit diagram for a 4-Finger balun according to the present invention.

FIG. 4B is a 4-Finger balun transformer. Balun 401 consists of transmission lines 404, 405, 406, 407, 408, 410, 412, and 414. Transmission line 404 is coupled to transmission lines 405 and 406. Input capacitor 402 is coupled to transmission lines 404, 405 and balun input 110. Transmission line 405 is coupled to transmission 407. A loading capacitor 418 is coupled to transmission lines 406, 407 and to a ground 416. Transmission lines 408, 410, 412, and 414 are coupled to ground 416. Output capacitor 422 is coupled to transmission lines 408, 412 and to positive balun output 112. Output capacitor 420 is coupled to transmission lines 410, 414 and to negative balun output 114. Transmission lines 404, 405, 408, and 412 are electromagnetically coupled. Transmission lines 406, 407, 410, and 414 are electromagnetically coupled. The electromagnetic coupling between transmission lines 404, 405, 406, 407, 408, 410, 412, and 414 result in a signal at output 112, in response to a signal applied to balun input 110, that is equal in amplitude and opposite in phase to a signal at output 114.

Transmission lines are formed from metal traces. Metal traces provide electrical and electromagnetic coupling. Transmission lines can be configured to function as coplanar waveguide transmission lines or microstrip transmission lines.

Figure 5A:
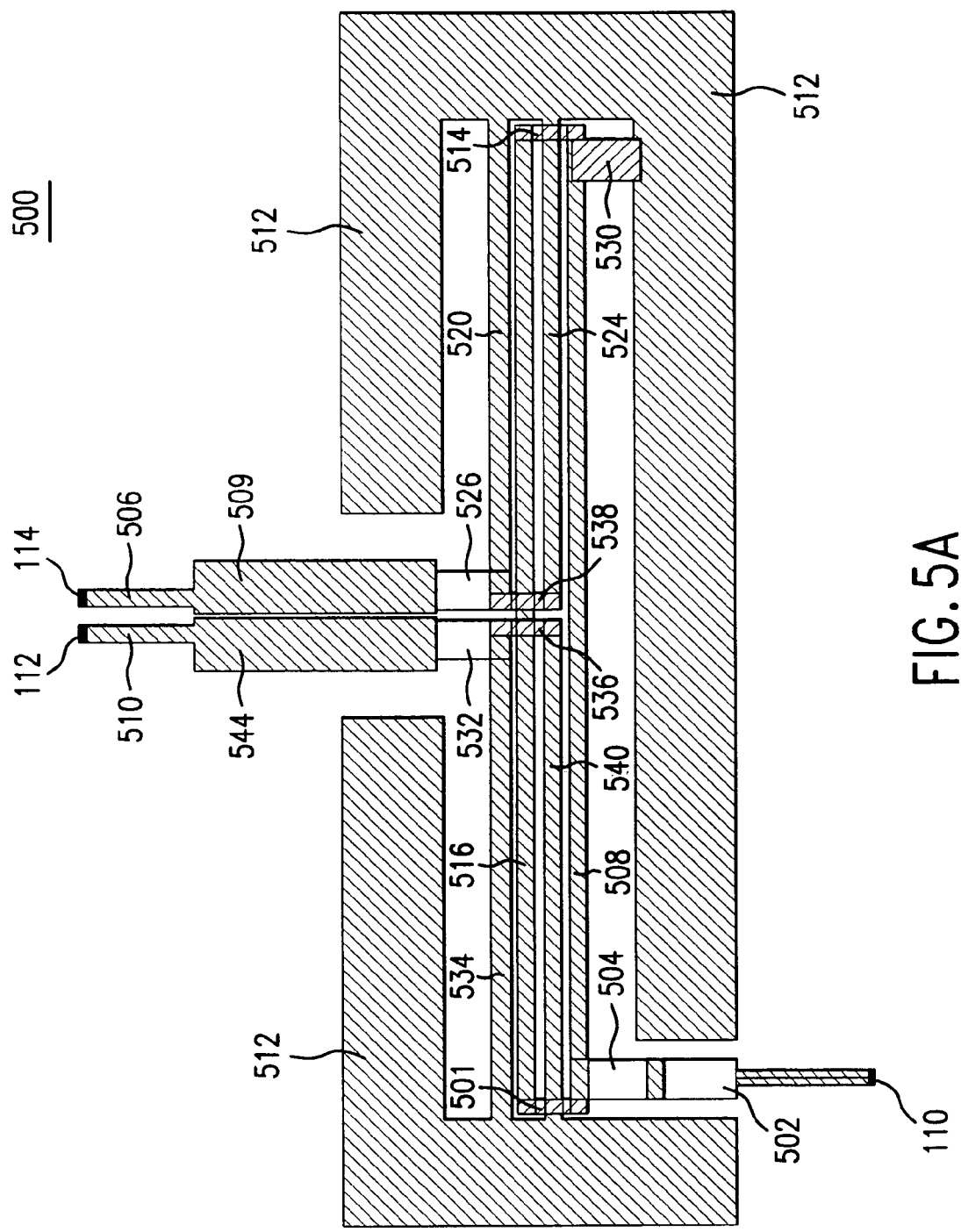
FIG. 5A illustrates a balun according to the present invention.

FIG. 5A, illustrates printed balun 500, which is a printed metal trace implementation of a balun according to the present invention. Printed balun 500 has two metal traces 508, 516 and two connecting traces 501, 514 electrically connected and laid out in a rectangular pattern. Metal traces 508 and 516 function as transmission lines. Four additional metal traces 520, 524, 534, and 540 are laid parallel to metal traces 508 and 516. Trace 520 and 524 are coupled to a ground 512 and connector 538. Metal traces 534 and 540 are coupled to ground 512 and connector 536. Metal traces 520, 524, 534, and 540 function as transmission lines. Input capacitor 504 is coupled to metal trace 508 and to input inductor 502. Input inductor 502 is coupled to balun input 110. A loading capacitor 530 is coupled between metal trace 508 and ground 512. Balun positive output 112 is coupled to thin metal trace 510. Thick metal trace 544 is coupled to thin metal trace 510 and output capacitor 532. Output capacitor 532 is coupled to metal trace 534. Balun negative output 114 is coupled to thin metal trace 506. Thick metal trace 509 is coupled to thin metal trace 506 and output capacitor 526. Capacitor 526 is coupled to metal trace 520. Electromagnetic coupling between transmission lines 508, 516, 520, 524, 534, and 540 result in a signal at output 112, in response to a signal applied to balun input 110, that is equal in amplitude and opposite in phase to a signal at output 114.

Inductor 502 and capacitor 504 add an input impedance matching network to balun 500. The addition of thick metal traces 544, 509 and thin metal traces 506, 510 add an output impedance matching network to balun 500. In the embodiment illustrated in FIG. 5A elements 506, 509, 510, and 544 are distributed elements. Metal trace width, trace spacing, trace proximity to ground and trace thicknesses are varied to achieve the capacitance and inductance values necessary to impedance match with the output circuit. In alternate embodiments elements 506, 509, 510, and 544 can be lumped element components.

The extent of ground 512 is indicated on FIGS. 5, 8, 9, and 11 by diagonal lines. For the embodiment illustrated in FIGS. 5A and 5B, ground 512 is at the periphery of balun 500. Ground 512 can be placed on different layers of the printed circuit board and coupled by vias 220 to the desired layer. In other embodiments ground 512 is placed under the balun.

The present invention, exemplified by balun 500, modifies the classic Marchand balun illustrated in FIGS. 1 and 2 by adding input capacitor 504, loading capacitor 530, output capacitor 532 and output capacitor 526. Coupling these elements to the balun transmission lines provides multiple improvements as discussed below.

The capacitance of elements 504, 530, 526, 532 is calculated so the balun operates at its most efficient internal impedance. Ground 512 is removed from beneath the balun metal traces and placed at the periphery for simplicity of fabrication. Four coupled transmission lines are employed rather than two in order to achieve the desired internal balun impedance without requiring the trace spacing to be the manufacturing minimum of 5-mils. A high, even mode/odd mode, impedance ratio increases the balun's impedance matching bandwidth and lowers insertion loss across a wider band of input frequencies.

The added capacitance of elements 504, 530, 526, and 532 electrically lengthens the balun by reducing transmission line wave velocity, thereby enabling the physical length of the transmission lines to be reduced to less than the classic balun's λ/4 length without affecting the unbalanced to balanced signal transformation. Reducing the required transmission line length means the physical size of the balun can be reduced. Reduced size makes it easier for a circuit designer to implement the balun on a crowded printed circuit board.

A further improvement to the classic Marchand balun is the addition of impedance matching networks at the balun input and outputs. The input matching network consists of inductor 502 and capacitor 504 series coupled at balun input 110. The output matching network consists of thick metal trace 509 coupled to thin metal trace 506, which is coupled to balun output 114. Thick metal trace 544 is coupled in series with thin metal trace 510, which is coupled to the balun output 112. These networks are designed to match the input impedance of the balun to the impedance of the input circuitry and the output impedance of the balun to the impedance of the output circuit. The matched input and output impedances provide improved signal transfer between the input and output circuits while the internal balun impedance is unaffected and optimized for high bandwidth, low loss and other factors.

The output impedance value is selected to match the circuitry coupled to the balun output. This impedance is typically 50 or 75 ohms; but is variable to match other circuit values.

In the present invention the input and output matching networks can be constructed from lumped elements or distributed elements. A person skilled in the art will understand the advantages and disadvantages of both types of elements.

In a preferred embodiment, essential features of the balun illustrated in FIG. 5A, such as the transmission lines, lumped and distributed components, are placed on the top layer of a printed circuit board. This simplifies balun construction and makes it more tolerant to manufacturing changes in printed circuit board layer width, dielectric constant, and printed trace dimensions. A lower metal layer can function to connect metal traces. Alternatively surface mount zero-ohm chip resistors can be used.

Figure 5B:
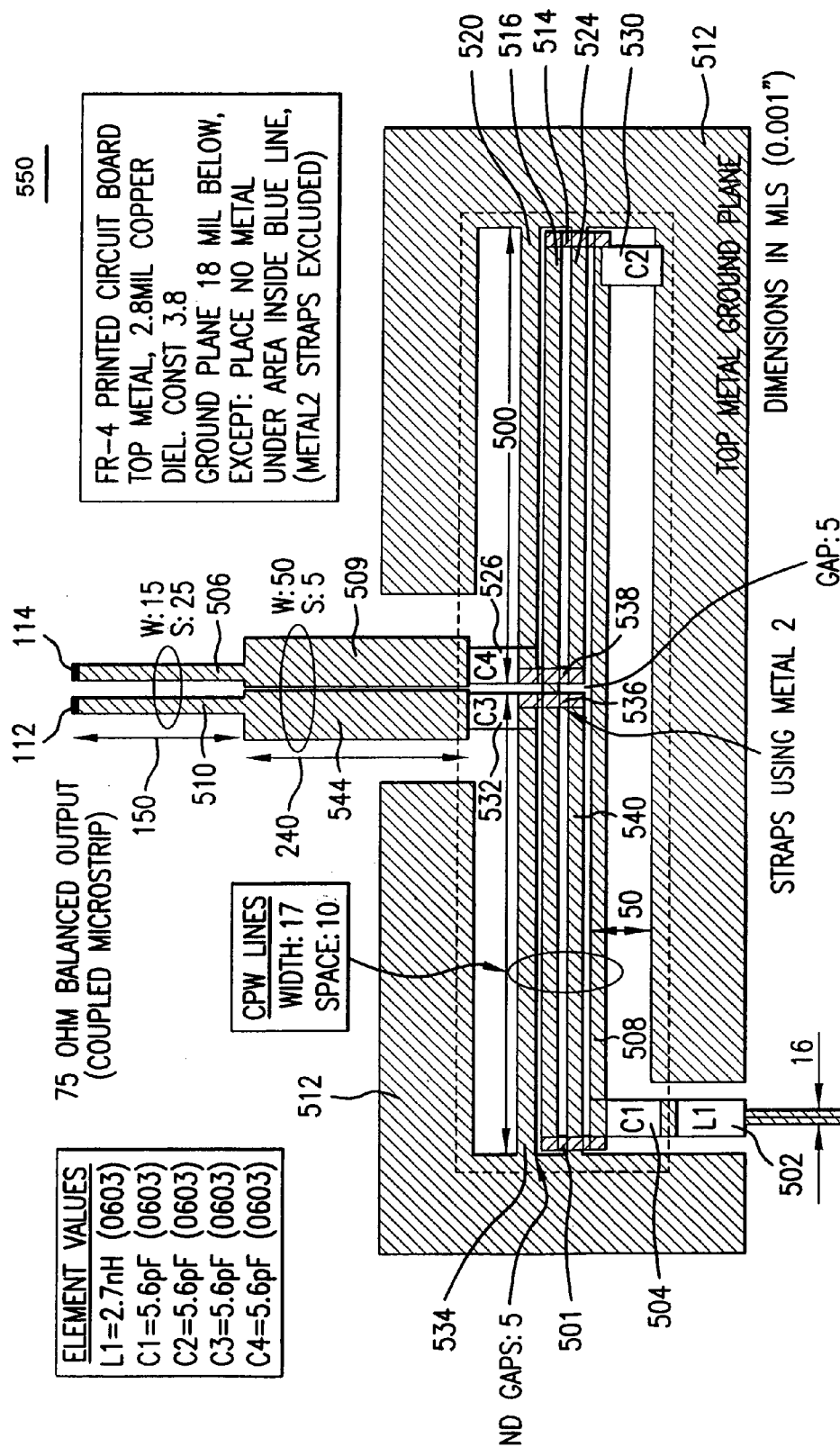
FIG. 5B illustrates an embodiment of a balun after calculating element values.

Referring to FIG. 5B, an embodiment of a balun 500 is presented as balum 550 with calculated element values and metal trace dimensions. Balun 550 shows common reference numbers with the balum 500 that were already discussed with reference to FIG. 5A. Balun 550 has the following electrical characteristics:

These performance specifications are for example only and are not meant to be limiting. Other performance specifications will be apparent to persons skilled in the art based on the disclosure provided herein.

The physical arrangement of metal traces in relation to each other and to electrical ground, determines whether the traces perform as coplanar waveguides or as microstrip transmission lines. Either type of transmission line can be used in the present invention to achieve the performance benefits discussed above.

The use of coplanar waveguide makes a ground under the balun traces optional, since the necessary configuration can be set on a single layer. Some embodiments use a ground under the balun metal traces to achieve better isolation and shielding from external noise sources.

Figure 6C:
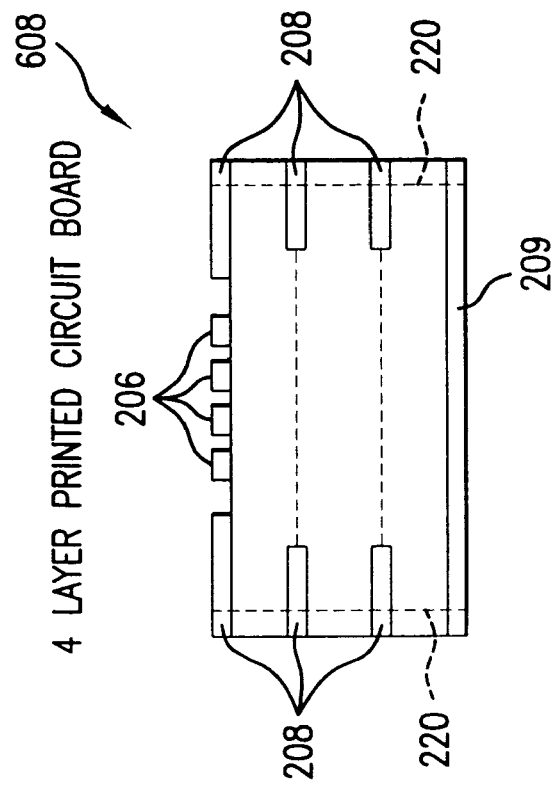
FIG. 6C illustrates a cross section of four layer printed circuit board without ground plane under the balun traces.
Figure 6D:
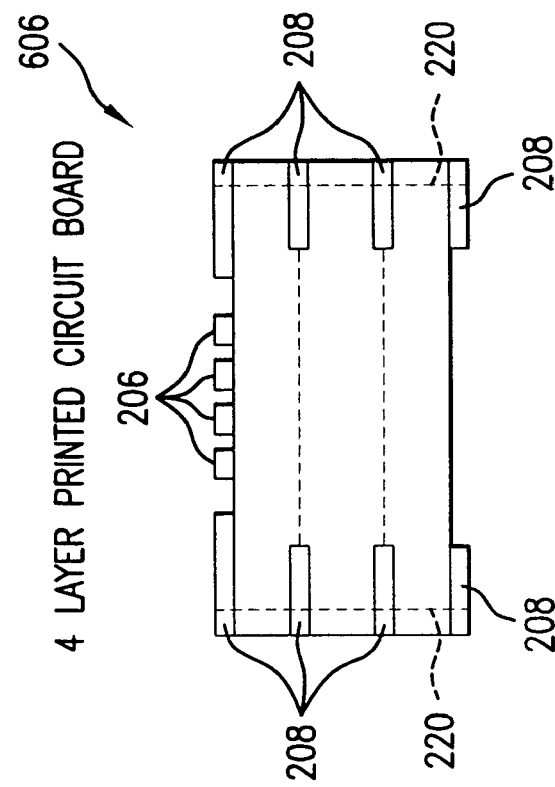
FIG. 6D illustrates a cross section of four layer printed circuit board with ground plane under the balun traces.
Figure 6F:
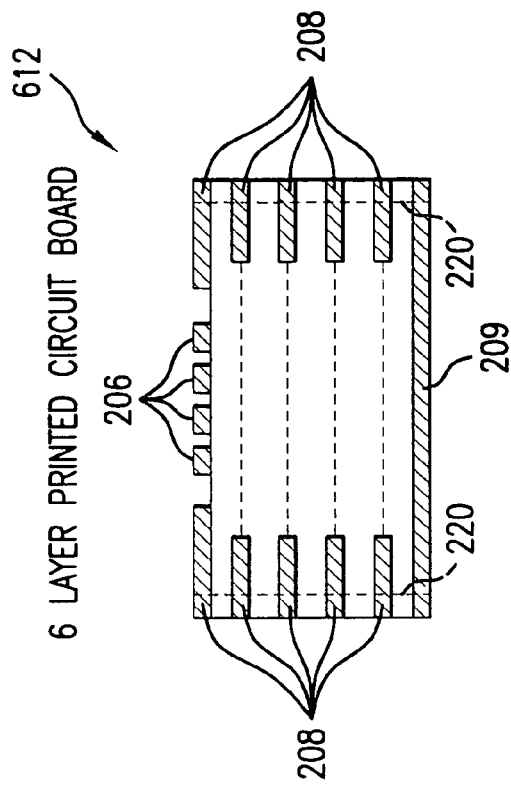
FIG. 6F illustrates a cross section of six layer printed circuit board with ground plane under the balun traces.
Figure 6E:
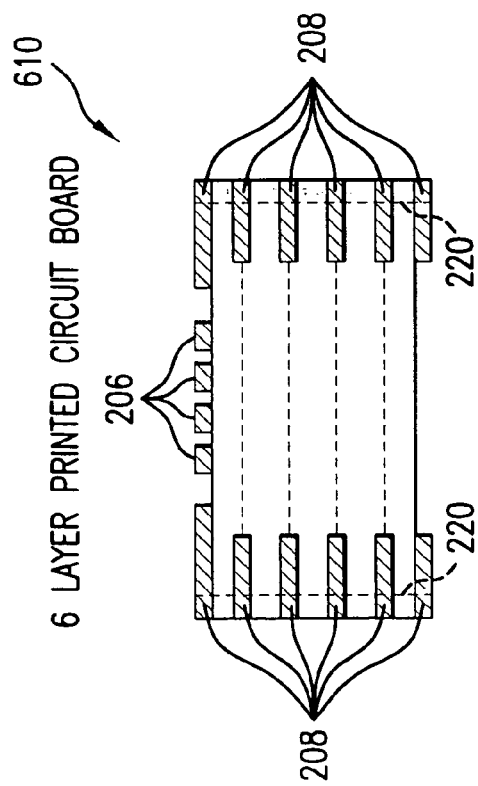
FIG. 6E illustrates a cross section of six layer printed circuit board without ground plane under the balun traces.

Referring to FIGS. 6A–6F, different arrangements of balun metal traces 206, ground 208 and ground 209 are illustrated. Vias 220 is used to connect ground 208, 209 together across printed circuit board (PCB) layers. FIG. 6A illustrates a two-layer PCB 602 with balun traces 206, ground 208 and vias 220 connecting ground 208 to ground 209. FIG. 6B illustrates a two-layer PCB 604 with ground 209 under balun traces 206. FIG. 6C illustrates a four-layer PCB 606 without ground 209 under balun traces 206. FIG. 6D illustrates a four-layer PCB 608 with ground 209 under balun traces 206. FIG. 6E illustrates a six-layer PCB 610 without ground 209 under balun traces 206. FIG. 6F illustrates a six-layer PCB 612 with ground 209 under balun traces 206. Balun 500 can be embodied in any of the printed board cross sections described in FIGS. 6A–6F as well as additional cross section arrangements that one of skill in the art would recognize based on the teachings herein.

One embodiment of balun 500 uses four coupled coplanar waveguides to strengthen the electromagnetic coupling, making the balun tolerant to variation in printed circuit board materials, dimensions and customer layout. Inexpensive lumped components can be used for tuning and impedance matching to a capacitive balun input. The geometry of the output lines functions as a distributed tuning network to provide another degree of freedom in matching the balun to a particular integrated circuit. Other embodiments use three couples transmission lines to achieve the desired performance.

Figure 7:
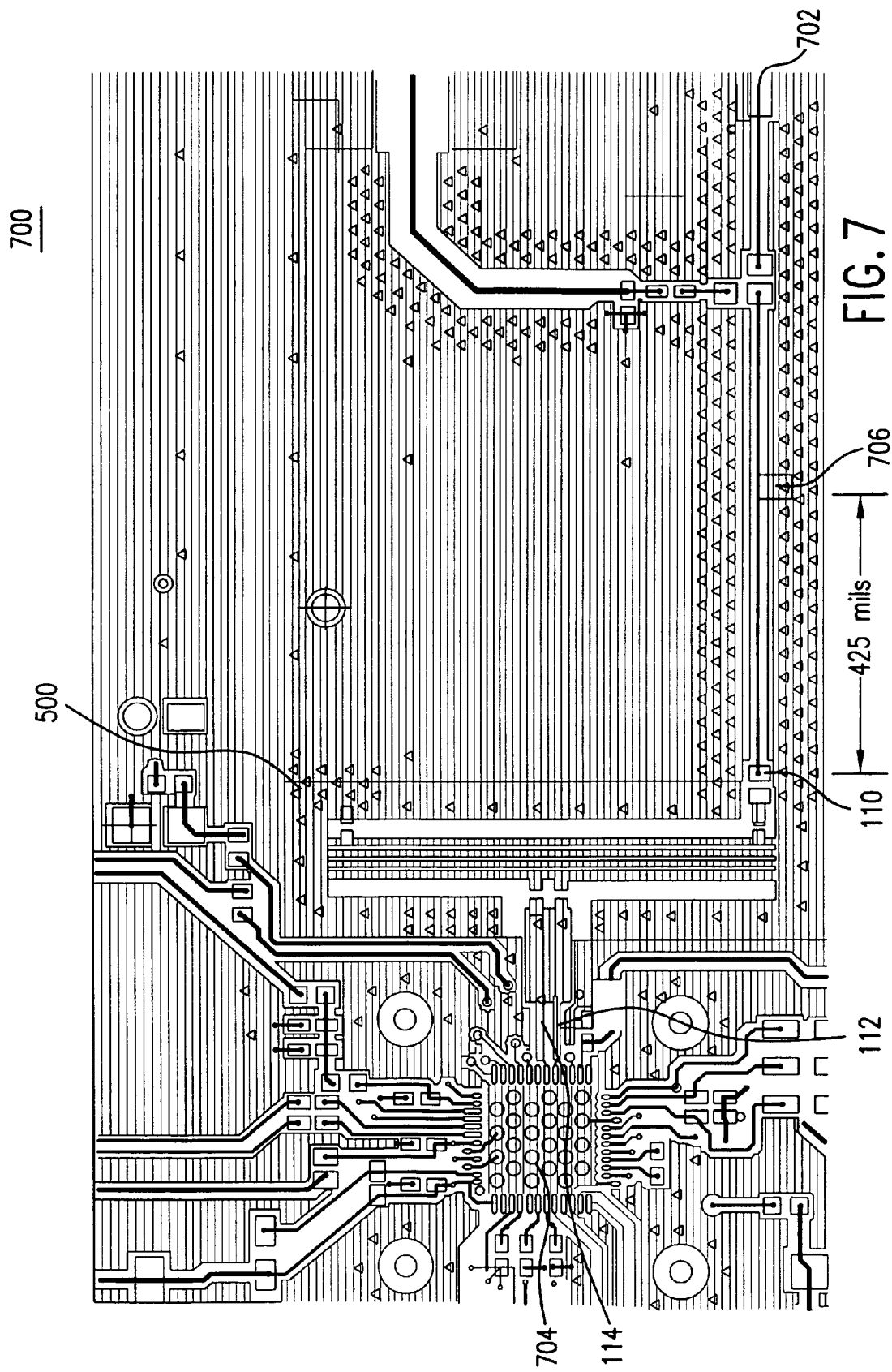
FIG. 7 illustrates an embodiment of the present invention on a printed circuit board.

FIG. 7 illustrates printed circuit 700, which is a printed circuit embodiment of the invention. Printed circuit 700 is balun 500 coupled to a radio frequency signal input 702 at balun input 110. Capacitor 706 is a one picofarad capacitor coupled approximately 425 mils from balun input 110. Balun output 112 and balun output 114 are coupled to a tuner 704. In one commercial embodiment, tuner 704 is the Broadcom BCM3440A0.

Figure 8:
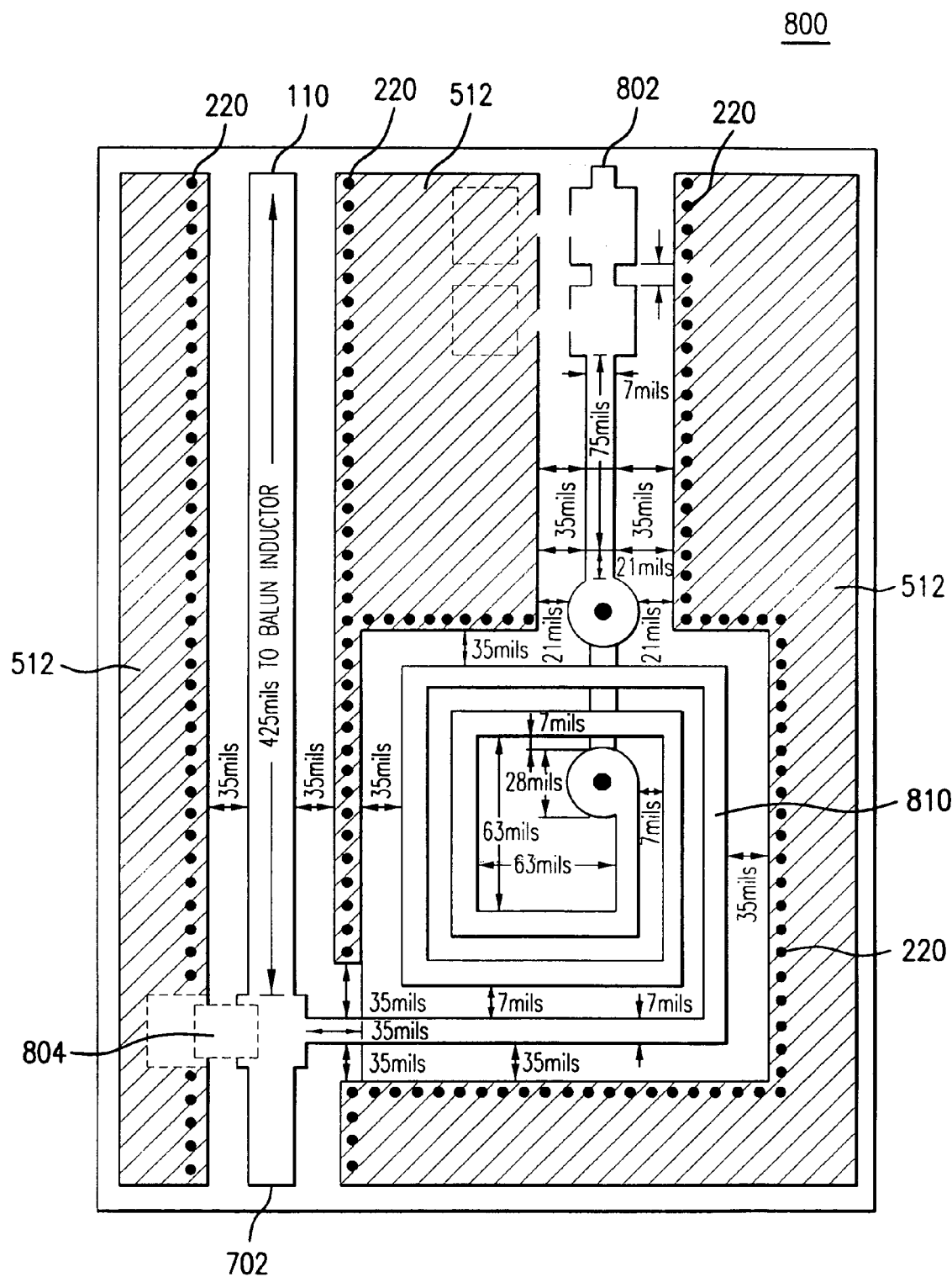
FIG. 8 illustrates an optimized inductor that can be used to transmit DC power or low frequency digital control signals to the center conductor of a balun according to an embodiment of the present invention.

FIG. 8 illustrates an apparatus 800 for transferring direct current power and low frequency digital control signals to low noise block 120 (see FIG. 1A) adapted for use with balun 500 (see FIG. 5A) the embodiment of FIG. 8 is presented with exemplary dimension values for the balun 800 including widths equal to 7 mils, 21 mils, 28 mils, 35 mils, and 63 mils, and spacing between element equal to 21 mils, 75 mils and 425 mils. Direct current power is defined as power supplied from a current source as direct current or from a voltage source as direct voltage. In addition to direct current power, low frequency digital control signals can be supplied to low noise block 120. A direct current power and low frequency digital control signal source 802 is coupled to spiral inductor 810. Direct current power and low frequency digital control signals can be supplied from source 802 together or either signal separately. Spiral inductor 810 is connected to balun radio frequency input 702, approximately 425 mils from balun input 110. Radio frequency input 702 is connected to coaxial cable 132. (see FIG. 1A) Coaxial cable 132 is connected to low noise block 120. A capacitor 804 is also coupled to ground 512 and to radio frequency input 702 approximately 425 mils from balun input 110. Capacitor 804 and inherent capacitance from the connection of spiral inductor 810 reduce undesirable cross over interference at balun input 110. Ground 512 is provided from vias 220. Individual vias are shown as solid dots but, for clarity, each is not labeled.

Spiral inductor 810 is designed to provide a very high impedance at the signal frequency of interest at balun input 110. Connection of spiral inductor 810 to balun input 110 has negligible loading effect on balun 500 and radio frequency input 702. The high impedance of spiral inductor 810 does not affect the transmission of direct current power or low frequency digital control signals. Spiral inductor 810 coupled to balun 500 is an embodiment of the present invention to provide direct current power and low frequency digital control signals along coaxial cable 132 to power low noise block 120. This embodiment does not deleteriously affect the radio frequency signal at balun input 110 or the electrical characteristics of the balun.

Figure 9:
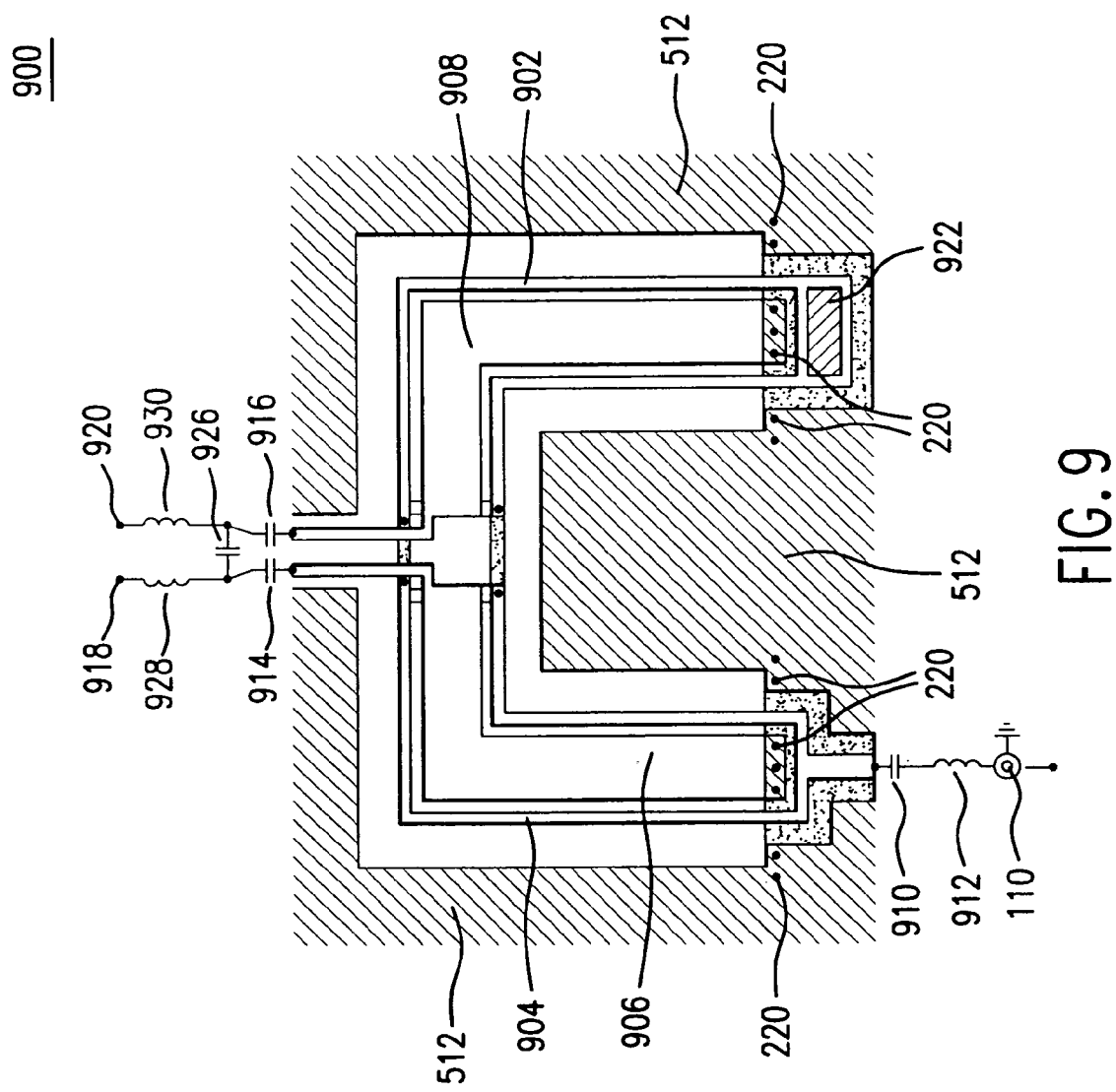
FIG. 9 illustrates the present invention using three transmission lines and a lumped element matching network.

FIG. 9 illustrates balun 900, which is an embodiment of the present invention that uses lumped capacitive and inductive components and three coupled transmission lines. This embodiment illustrates the design flexibility of the present invention. It shows metal trace dimensions and the number of coupled transmission lines can be varied to achieve a desired result. Balun 900 consists of a first input transmission line 902 electrically coupled to a second input transmission line 904 and laid out in a rectangular pattern. A first output transmission line 906 is coupled to a second output transmission line 908 and to ground 512. Input transmission lines 902 and 904 are coupled to an input capacitor 910. An input inductor 912 is coupled to input capacitor 910 and to balun input 110. First output transmission line 906 is coupled to an output capacitor 914. Output capacitor 914 is coupled to an output inductor 928. Output inductor 928 is coupled to a positive balun output 918. Second output transmission line 908 is coupled to an output capacitor 916. Output capacitor 916 is coupled to an output inductor 930. Output inductor 930 is coupled to a negative balun output 920. Electromagnetic coupling between transmission lines 904 and 906 and electromagnetic coupling between 902 and 908 result in a signal at balun output 918 in response to a signal applied to balun input 110, which is equal in amplitude and opposite in phase to a signal at output 920.

A loading capacitor 922 is coupled to transmission lines 902 and 904 and to ground 512. Loading capacitor 922 is equivalent to capacitor 530. (see FIG. 5A) Capacitor 922 can be fabricated as a distributed or a lumped element capacitor. A tuning capacitor 926 is coupled across the outputs of capacitor 914 and capacitor 916. Capacitor 926 provides a differential capacitance on balun 900 to allow finer tuning of the internal balun impedance and thereby reduce input return loss. Ground 512 is provided from vias 220. Individual vias are shown as solid dots but, for clarity, each is not labeled.

Figure 10:
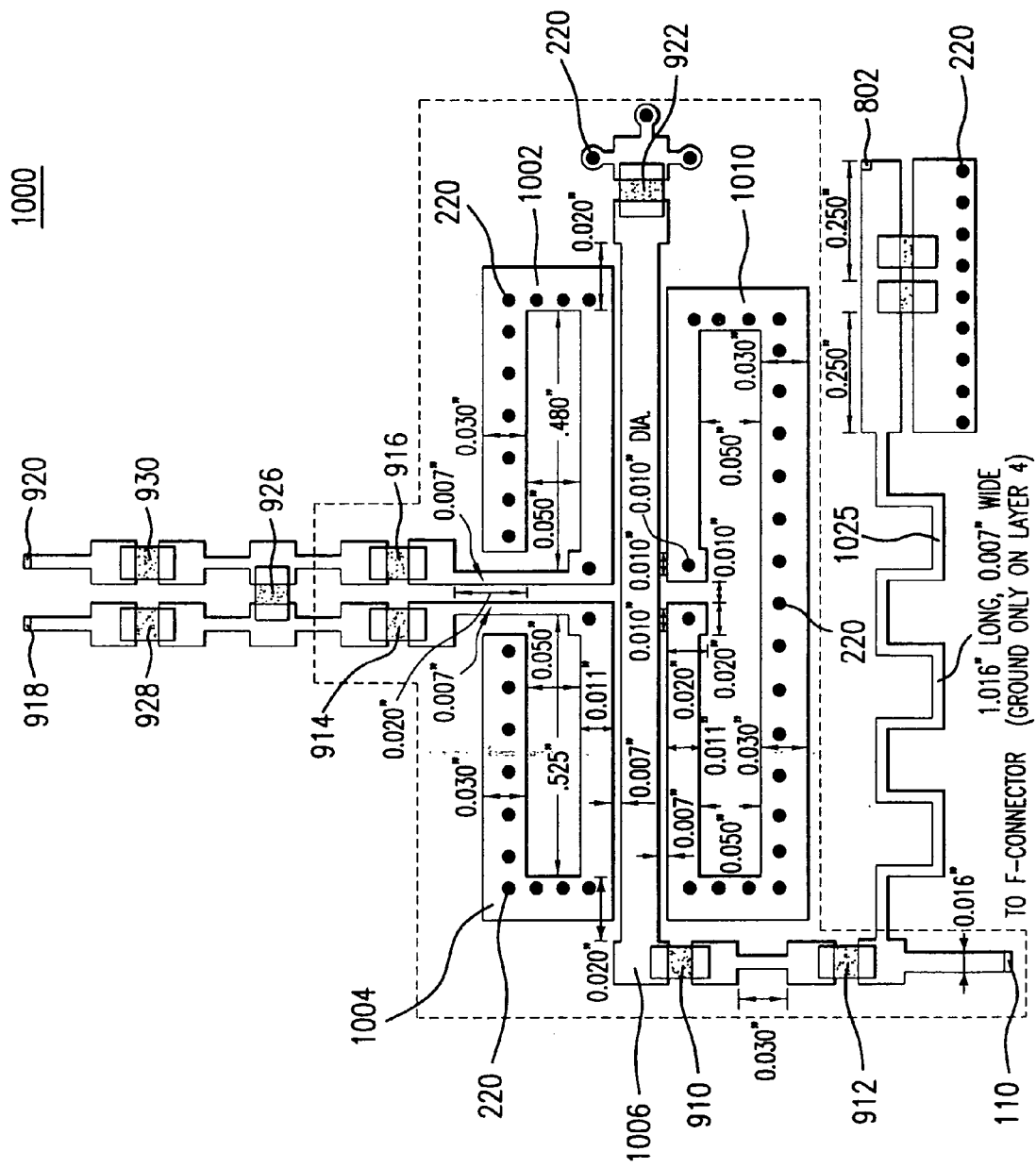
FIG. 10 illustrates an alternate embodiment of the 3-Finger balun with a ground below the balun according to the present invention.

FIG. 10 illustrates balun 1000 which is and embodiment of the present invention the embodiment of FIG. 10 is presented with exemplary dimension valurs for the balun 1000 including widths equal to 0.007", 0.011", 0.016", 0.020", 0.030", 0.050", 0.480", and 0.525", spacing between elements equal to 0.020" and 0.250", and diameters equal to 0.010". Balun 1000 has balun input 110 coupled to input capacitor 912. Capacitator 912 is connected to conductor 910. An input transmission line 1006 is coupled to inductor 910 ant to loading capacitor 922. Capacitor 922 is coupled between transmission line 1006 and ground. Transmission lines 1002, 1004, and 1010 are electrically coupled to output capacitor 914 and output capacitor 916. Output inductor 930 is connected to balun negative output 920. Output inductor 928 is connected to output capacitor 914 and balun positive output 918. Tuning capacitor 926 is connected between the output side of capacitors 914 and 916. Transmission line 1006 is electromagnetically coupled to transmission lines 1002, 1004, and 1010 that results in a signal at output 918, in response to a signal applied to balun input 110, that is equal in amplitude and opposite in phase to a signal at output 920.

Ground is provided from vias 220. Individual vias are shown as solid dots but, for clarity, each is not labeled. Also for clarity, diagonal lines are not used to show the location of ground. Elements containing vias 220 are coupled to ground. In the embodiment shown in FIG. 10 ground is located on layer two under everything except balun. There is also a ground on layer four located beneath everything.

FIG. 10 also illustrates an embodiment of a device used to provide direct current and voltage power or low frequency digital control signals to low noise block 120 (see FIG.1A) Direct current power and low frequency digital control signal source 802 is coupled to meandered trace 1025. Trace 1025 is coupled to balun 1000 between input 110 and input capacitor 912. Meandered trace 1025 provides a high impedance to data signal 122 to minimize undesired electrical loading of balun 1000 and low noise 120. FIG. 10 shows meandered trace 1025 as having exemplary dimensions of 1.016" long and 0.007" wide.

Figure 11:
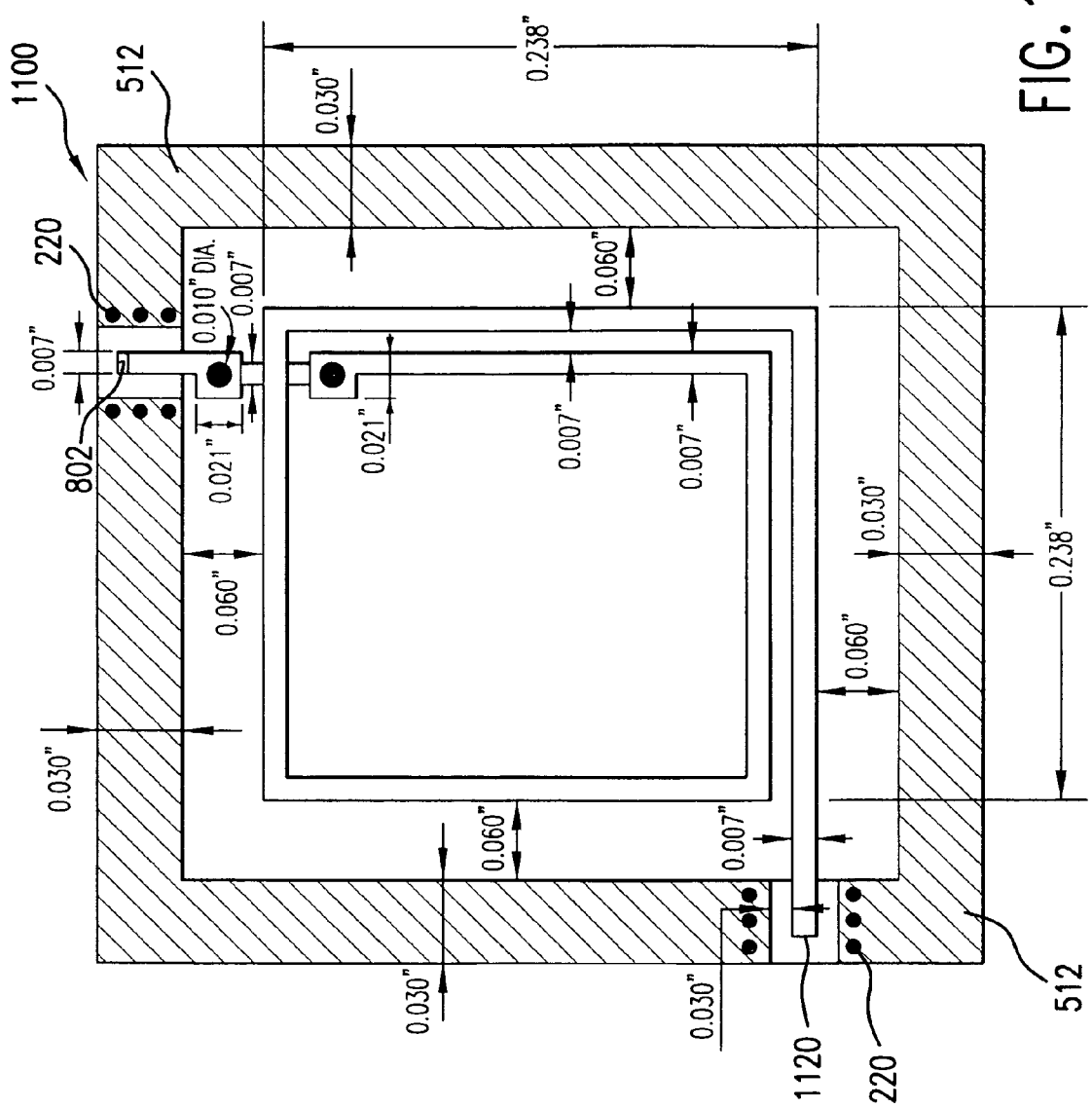
FIG. 11 illustrates an inductor for providing DC power or low frequency digital control signals at the balun input in an embodiment of the present invention.

FIG. 11 illustrates an alternate embodiment of a spiral inductor used to transfer direct current power and low frequency digital control signals to coaxial cable 132. (see FIG. 1A) The embodiment of FIG. 11 is presented with exemplary dimension values for the balun 1100 including widths equal to 0.007", 0.021", 0.060", and 0.238" and a diameter equal to 0.010". Spiral inductor 1100 has direct current power and low frequency digital control signal source 802. A connection 1120 couples spiral 1100 to balun input 110. Ground 512 is provided from vias 220. Individual vias are shown as solid dots but, for clarity, each is not labeled. Ground 512 is also located under the spiral elements. For clarity the ground under spiral inductor 1100 is not illustrated with diagonal lines. The top layer ground 512 is shown with diagonal lines.

The high impedance exhibited by inductor 1100 does not effect the operation of balun 500 (see FIG. 5A) or coaxial cable 132 at signal frequencies of 950 to 2150 MHZ. Direct current power and low frequency digital control signals are unaffected by the high impedance. The direct current power and low frequency digital control signals are placed on the center connector of coaxial cable 132 and applied to low noise block 120. Inductor 1100 is an embodiment of inductor 800 modified to function with ground under the metal traces. Spiral inductor 1100 can be used in place of meandered trace 1025 for coupling direct current power and low frequency digital control signal source 802 to balun input 110.

Figure 12:
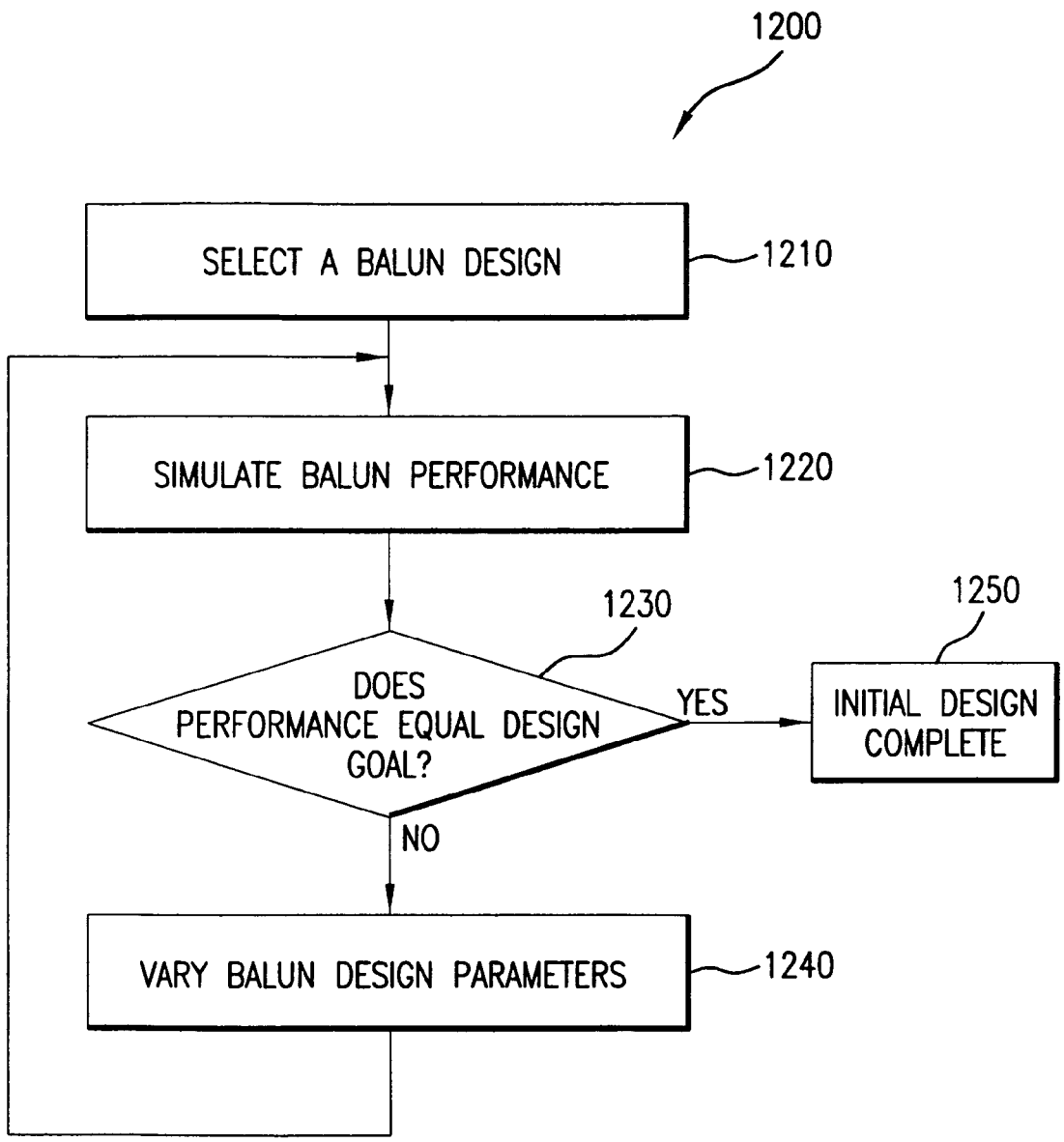
FIG. 12 illustrates steps of a method for initially designing a balun according to the present invention.

FIG. 12 illustrates a method 1200 for initial design of a balun according to the present invention. In step 1210, a design for the balun is selected. In step 1230, the performance of the balun is simulated. In step 1230, the performance of the balun is compared with the design goal performance. If the simulated performance is equal or better than design goal performance (YES), the initial design is complete, step 1250. If simulated performance is less than design goal performance (NO), the existing parameters are varied, step 1240. Then step 1220 is performed again to simulate the balun performance. Steps 1220, 1230 and 1240 continue until the initial balun design is complete in step 1250.

Figure 13:
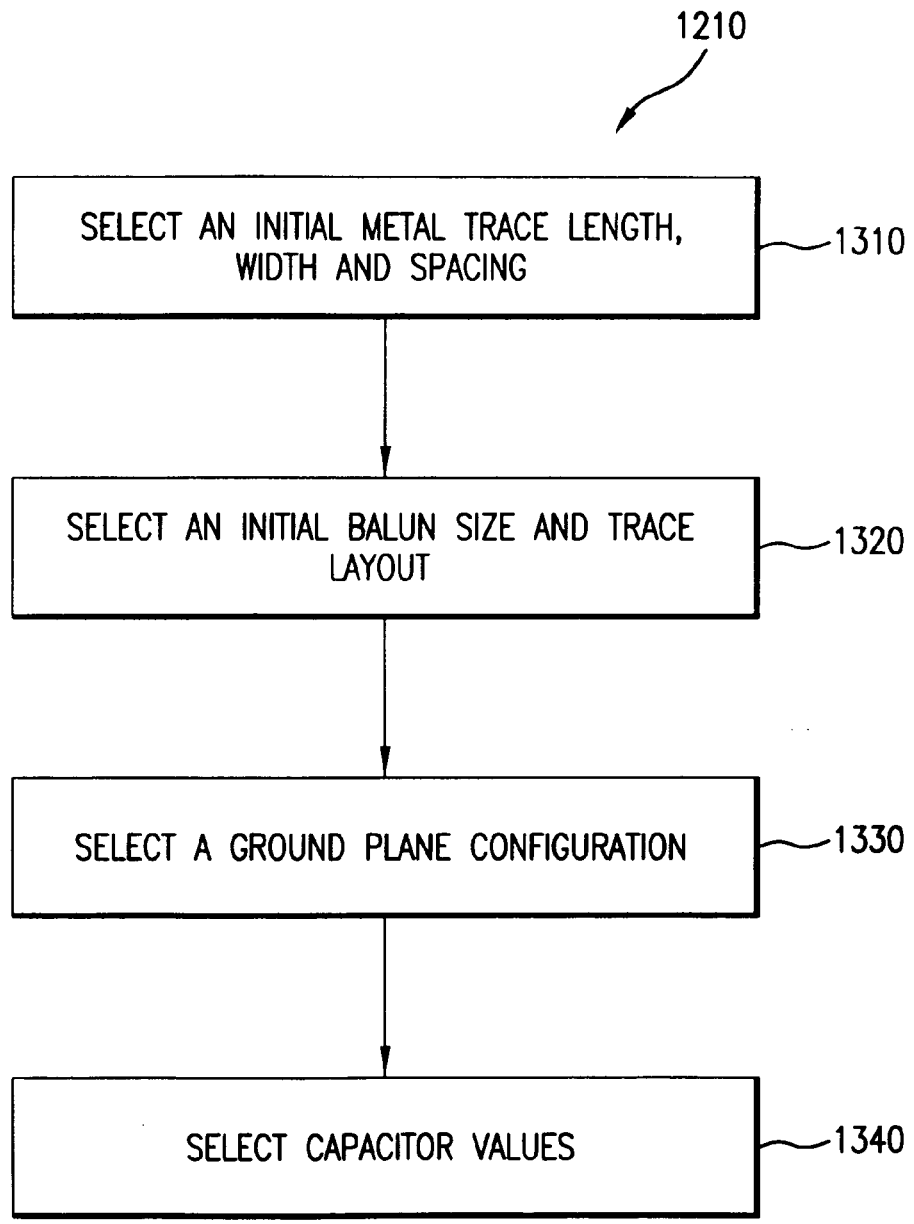
FIG. 13 illustrates details of the method step of selecting initial design parameters.

Step 1210 is shown in further detail in FIG. 13. In step 1310, an initial length, width and spacing of the metal traces are selected. These values are the balun designer's best estimates of the components and configuration necessary to achieve the balun design goals. In step 1320, initial physical size constraints and an initial metal trace layout are selected. These constraints account for any size or configuration constraints placed on the balun design in its intended use. In step 1330, an initial ground plane configuration is selected. In step 1340, an initial value is selected for individual capacitors 404, 410, 426, and 432.

Figure 14:
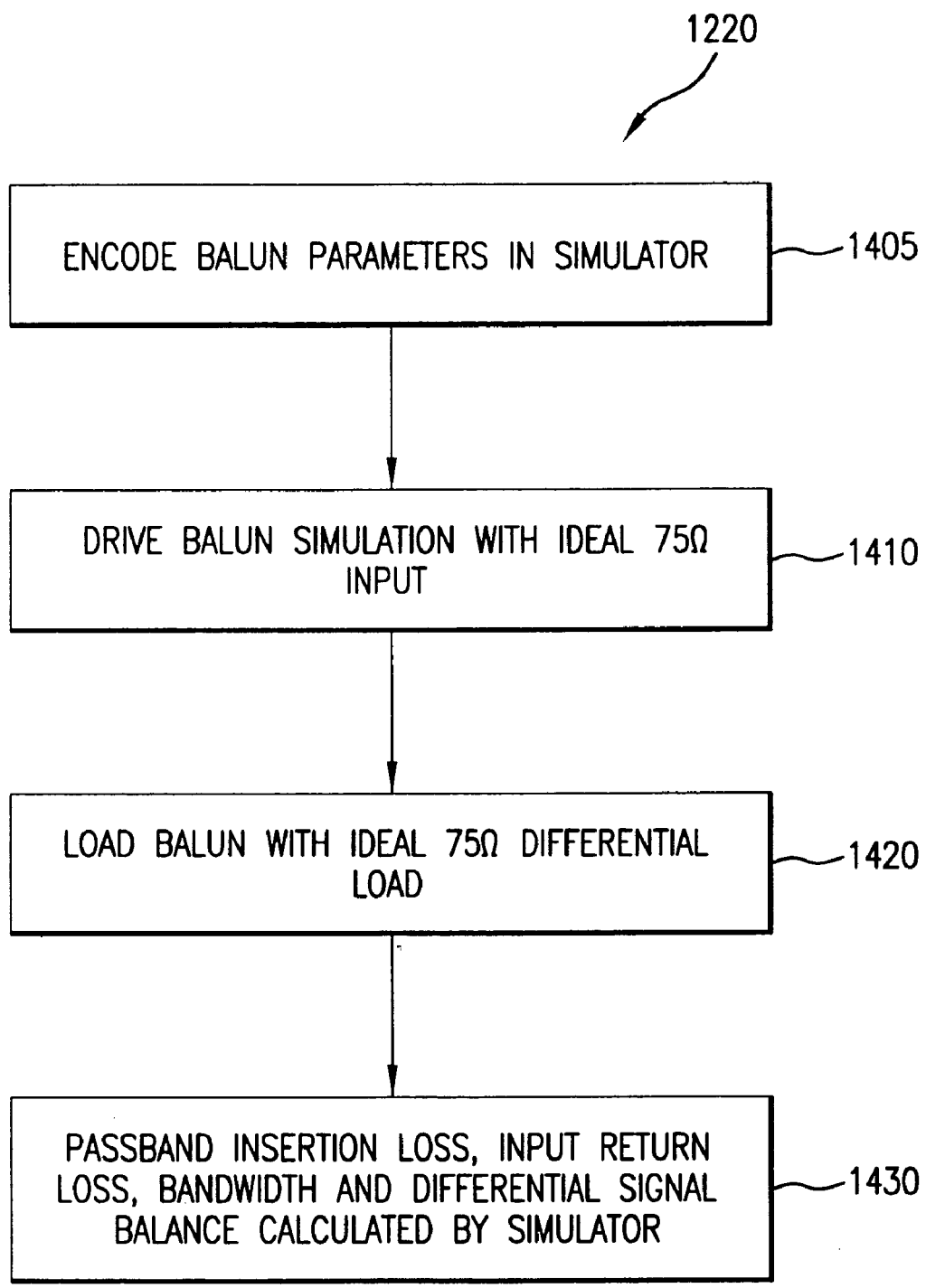
FIG. 14 illustrates details of the method step of simulating balun performance.

Step 1220 is shown in further detail in FIG. 14. In step 1405, the balun parameters are encoded in a simulator. In step 1410, the balun simulation is driven with a characteristic input impedance. In an embodiment the input impedance is 75 ohms. In step 1420, the balun is loaded with a substantially balanced differential load. This output load is a simplification of the load expected in the actual circuit embodiment. An ideal value is selected to allow the balun simulation to more easily converge on a solution. The substantially balanced differential load does not reflect the floating load anticipated in an actual circuit embodiment of the balun. In step 1430, the balun passband insertion loss, input return loss, bandwidth and differential signal balance are calculated by the simulator.

Figure 15:
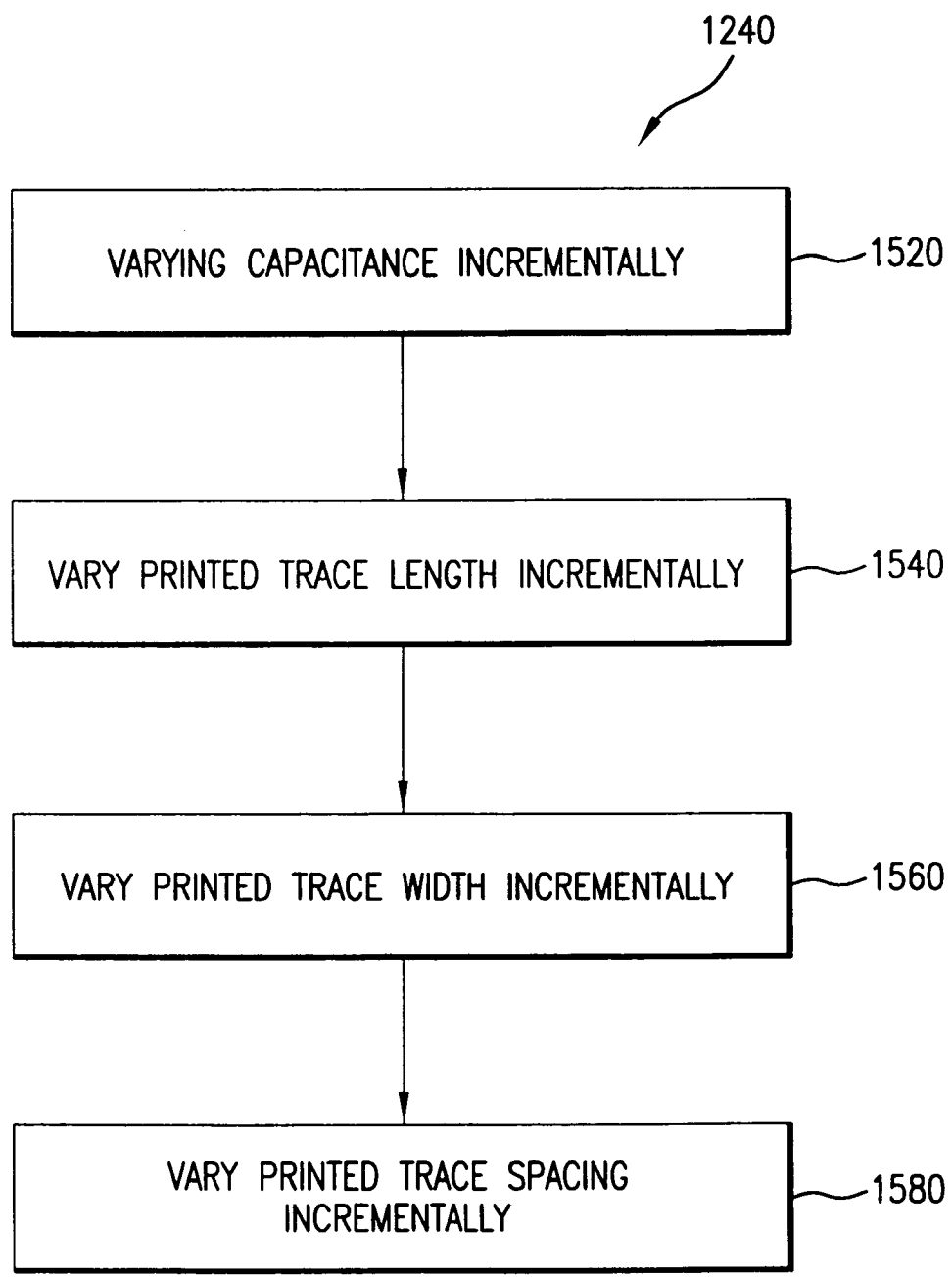
FIG. 15 illustrates details of the method step of incrementally varying balun parameters.

Step 1240 is shown in further detail in FIG. 15. In step 1520, the value of a capacitor is varied incrementally in a manner to result in balun performance closer to the design goal. In one embodiment, an example of the specific capacitors varied in this step are the input capacitor 404, the loading capacitor 410, output capacitor 426, and output capacitor 432. In step 1540, the printed metal trace lengths are varied incrementally in a manner to result in balun performance closer to the design goal. In step 1560, the printed trace widths are varied incrementally in a manner to result in balun performance closer to the design goal. In step 1580, the printed metal trace spacing is varied incrementally in a manner to result in balun performance closer to the design goal.

Figure 16:
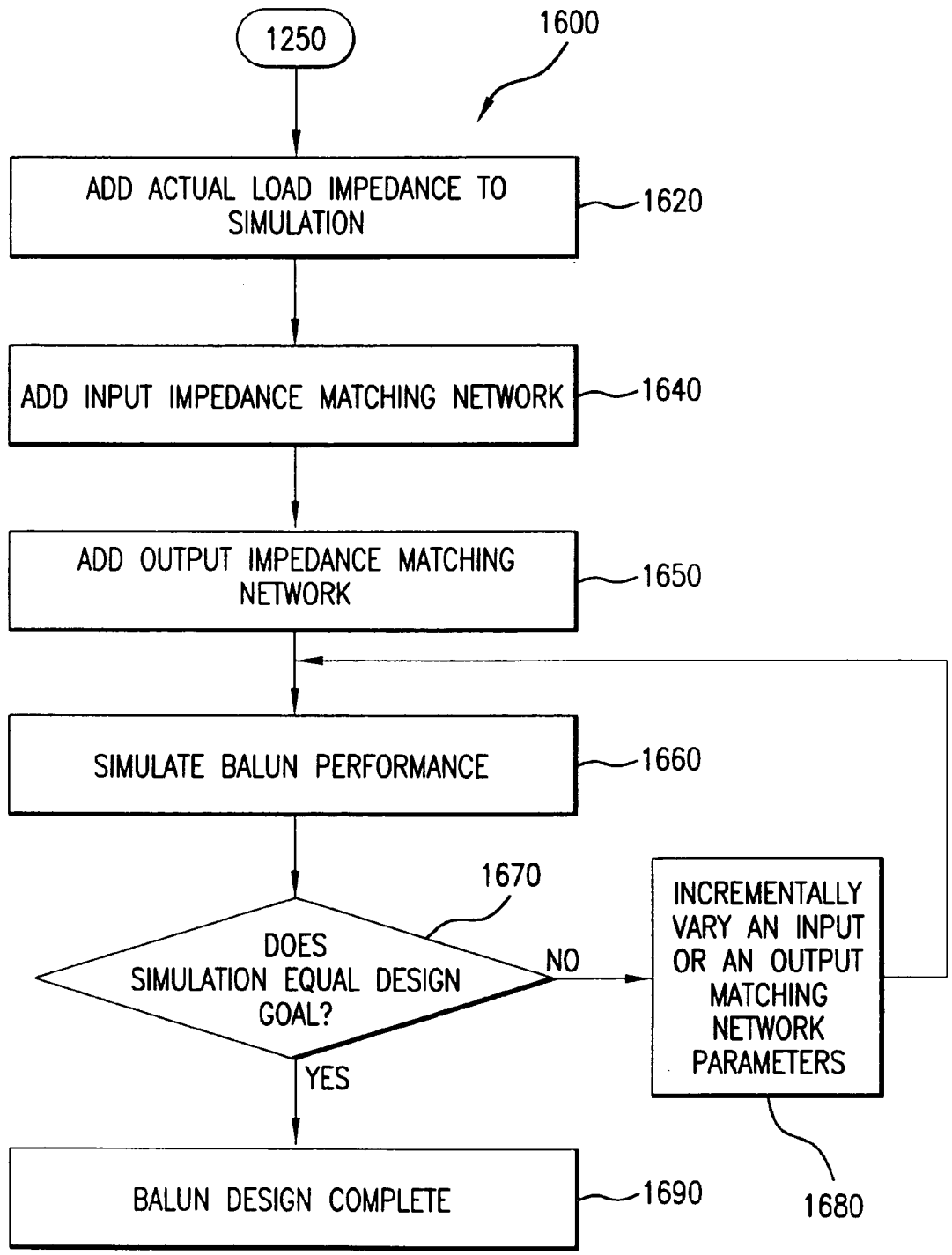
FIG. 16. illustrates steps of a method for final balun design according to the present invention.

FIG. 16 illustrates the method 1600 of final balun design. Step 1250 occurs after the balun initial design is complete. In step 1620, the actual load impedance is encoded in the balun simulator. In step 1640, an impedance matching network is coupled to the balun input. In step 1650, an impedance matching network is coupled to each side of the balun differential output. In step 1660, the balun performance is simulated. In step 1670, the balun simulated performance is compared with design goal performance. If simulated is equal or greater than design goal performance, (YES), step 1690 is performed. In step 1690, balun design is completed. If simulated performance is less than a design goal, (NO), step 1680 is performed. In step 1680, the value of an element in the input and output matching networks is varied incrementally in a manner to result in balun performance closer to the design goal. Then step 1660 is performed. Steps 1660, 1670, and 1680 are performed in sequence until simulated balun performance is equal to or better than design goal performance.

Conclusion

Example embodiments of the methods, systems, and components of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. An integrated circuit, comprising:
a capacitively loaded balun, wherein said capacitively loaded balun includes:
a plurality of first coupled metal traces coupled to an electrically unbalanced input of said capacitively loaded balun, wherein each of said first coupled metal traces includes a first metal trace and a second metal trace and said first metal trace and second metal trace are coupled to each other at a first end of each metal trace and wherein a second end of each second metal trace is coupled to said electrically unbalanced input,
a plurality of second coupled metal traces, wherein said plurality of second coupled metal traces are coupled to ground, a first of said second coupled metal traces is coupled to a first electrically balanced output, and a second of said second coupled metal traces is coupled to a second electrically balanced output, and
a capacitor coupled between a second end of said first metal trace of each of said plurality of first coupled metal traces and ground, wherein said capacitor electrically loads said plurality of first coupled metal traces so that each metal trace in said plurality of first coupled metal traces and said plurality of second coupled metal traces has a physical length less than one-quarter wavelength of an input signal received at said electrically unbalanced input of said capacitively loaded balun;
a first circuit, coupled to said electrically unbalanced input of said capacitively loaded balun; and
a second circuit, coupled to said first and second electrically balanced outputs of said capacitively loaded balun;
wherein said electrically unbalanced input is impedance matched to said first circuit and said electrically balanced electrical output is impedance matched to said second circuit.

2. The integrated circuit of claim 1, further comprising:
a metal trace coupled to said electrically unbalanced input, said metal trace having a high impedance to an input signal over a desired frequency range.

3. The integrated circuit of claim 2, wherein said desired frequency range is approximately 950 to 2150 megahertz.

4. The integrated circuit of claim 1, wherein the capacitively loaded balun further comprises:
a first metal trace coupled to said first electrically balanced output of said capacitively loaded balun;
a second metal trace coupled to said second electrically balanced output of said capacitively loaded balun;
a third metal trace coupled between said first metal trace and a first metal trace of said first of said plurality of second coupled metal traces; and
a fourth metal trace coupled between said second metal trace and a second metal trace of said second of said plurality of second coupled metal traces,
wherein said first, second, third, and fourth metal traces match an output impedance of said capacitively loaded balun to an impedance of said second circuit.

5. The integrated circuit of claim 4, wherein a width of said first metal trace is narrower than a width of said third metal trace and a width of said second metal trace is narrower than a width of said fourth metal trace.

6. The integrated circuit of claim 1, wherein said first circuit includes a means for providing a radio frequency signal and said second circuit includes a tuner.

* * * * *

UNITED STATES PATENT AND TRADEMARK OFFICE
CERTIFICATE OF CORRECTION

PATENT NO. : 7,215,218 B2
APPLICATION NO. : 10/984771
DATED : May 8, 2007
INVENTOR(S) : Burns et al.

It is certified that error appears in the above-identified patent and that said Letters Patent is hereby corrected as shown below:

After Column 7, line 30
Please add:
--Impedance: 75 unbalanced in/balanced out
 Bandwidth: 950-2150 MHZ
 Insertion loss: <0.7 dB
 Input return loss: >10 dB with BCM3440 Satellite Tuner LNA at output--.

Signed and Sealed this

Seventh Day of August, 2007

JON W. DUDAS
*Director of the United States Patent and Trademark Office*